United States Patent
Kimura

(10) Patent No.: US 9,935,141 B2
(45) Date of Patent: Apr. 3, 2018

(54) SEMICONDUCTOR DEVICE AND MANUFACTURING METHOD THEREOF

(71) Applicant: Renesas Electronics Corporation, Tokyo (JP)

(72) Inventor: Masatoshi Kimura, Ibaraki (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/287,888

(22) Filed: Oct. 7, 2016

(65) Prior Publication Data

US 2017/0125466 A1    May 4, 2017

(30) Foreign Application Priority Data

Oct. 30, 2015    (JP) .................. 2015-215205

(51) Int. Cl.
  *H01L 27/146*    (2006.01)
  *H01L 27/148*    (2006.01)
  (Continued)

(52) U.S. Cl.
  CPC .... *H01L 27/14614* (2013.01); *H01L 27/1464* (2013.01); *H01L 27/14616* (2013.01); *H01L 27/14625* (2013.01); *H01L 27/14636* (2013.01); *H01L 27/14643* (2013.01); *H01L 27/14689* (2013.01); *H04N 5/335* (2013.01)

(58) Field of Classification Search
  CPC ........ H01L 27/14614; H01L 27/14689; H01L 27/14625; H01L 27/14616; H01L 27/1464; H01L 27/14636; H01L 27/14643; H01L 31/062; H01L 31/0232; H01L 23/544
  USPC ....... 257/222, 225, 228, 230, 291, 292, 233, 257/432, E27.131, E27.132, E27.134, 257/E31.083, E31.091, E31.127, E21.002;
  (Continued)

(56) References Cited

U.S. PATENT DOCUMENTS 5,955,753 A * 9/1999 Takahashi ......... H01L 27/14609
                                                    257/231
7,238,926 B2 * 7/2007 Guidash ............. H04N 5/37457
                                                    250/208.1
(Continued)

FOREIGN PATENT DOCUMENTS

JP    2004-228645 A    8/2004
JP    2013-093554 A    5/2013

OTHER PUBLICATIONS

Perceval Coudrain et al., "Towards a Three-Dimensional Back-Illuminated Miniaturized CMOS Pixel Technology using 100 nm Inter-Layer Contacts", 2009 International Image Sensor Workshop (IISW), Jun. 25-28, 2009, session 02-02, Norway.

*Primary Examiner* — Dao H Nguyen
(74) *Attorney, Agent, or Firm* — Sughrue Mion, PLLC

(57) ABSTRACT

In a semiconductor device in which a plurality of light receiving elements are provided in each of a plurality of pixels that form a solid-state image sensor, a decrease in the performance of the semiconductor device is prevented, the decrease occurring due to an increase in the number of wires. In the pixel having a first photodiode and a second photodiode, a first transfer transistor coupled to the first photodiode and a second transfer transistor coupled to the second photodiode are respectively controlled by the same gate electrode, thereby allowing the number of wires for controlling the first and the second transfer transistors is reduced.

19 Claims, 20 Drawing Sheets

(51) Int. Cl.
*H01L 31/062* (2012.01)
*H04N 5/335* (2011.01)

(58) Field of Classification Search
USPC .......... 438/57, 59, 60, 70, 78; 348/302, 308,
348/311, E3.021, E5.091, E9.01
See application file for complete search history.

(56) References Cited

U.S. PATENT DOCUMENTS

| | | | |
|---|---|---|---|
| 8,319,874 B2 * | 11/2012 | Suzuki | H01L 27/14603 |
| | | | 348/308 |
| 9,209,211 B2 * | 12/2015 | Manouvrier | H01L 27/14614 |
| 9,237,281 B2 | 1/2016 | Fukuda | |
| 9,559,131 B2 * | 1/2017 | Tatani | H01L 27/14603 |
| 2002/0121652 A1 * | 9/2002 | Yamasaki | G02B 7/34 |
| | | | 257/222 |
| 2005/0012836 A1 * | 1/2005 | Guidash | H04N 3/1562 |
| | | | 348/302 |
| 2013/0076953 A1 * | 3/2013 | Sekine | H04N 5/343 |
| | | | 348/311 |
| 2016/0013239 A1 * | 1/2016 | Kasaoka | H01L 27/14643 |
| | | | 257/225 |

* cited by examiner

SEMICONDUCTOR DEVICE AND MANUFACTURING METHOD THEREOF

CROSS-REFERENCE TO RELATED APPLICATIONS

The disclosure of Japanese. Patent Application No. 2015-215205 filed on Oct. 30, 2015 including the specification, drawings and abstract is incorporated herein by reference in its entirety.

BACKGROUND

The present invention relates to a semiconductor device and a manufacturing method thereof, and in particular, to a technique effective when applied to a semiconductor device including a solid-state image sensor.

In order to capture a high-quality moving picture by using a digital camera, it is important to perform auto focus detection at high speed and accurately. A digital camera has been recently developed, in which a solid-state image sensor including a plurality of pixels each provided with two photoelectric conversion parts is used and auto focus adjustment is performed by an image surface phase difference detection method.

Patent Document 1 (Japanese Unexamined Patent Application Publication No. 2004-228645) describes that, in a solid-state image sensor in which the space between pixels is small, microlenses over the pixels are arranged at non-linear pitches. Additionally, Patent Document 2 (Japanese Unexamined Patent Application Publication No. 2013-93554) describes that, in a solid-state image sensor in which the space between pixels is small and two photodiodes are arranged in one pixel, the shape of a microlens over the pixel is changed. Additionally, Non-Patent Document 1 describes a pixel pattern layout adopted when the space between pixels is small.

RELATED ART DOCUMENTS

Patent Documents

[Patent Document 1] Japanese Unexamined Patent Application Publication No. 2004-228645
[Patent Document 2] Japanese Unexamined Patent Application Publication No. 2013-93554

Non-Patent Document

[Non-Patent Document 1] Perceval Coudrain and other nine people, "Towards a Three-Dimensional Back-Illuminated Miniaturized CMOS Pixel Technology using 100 nm Inter-Layer Contacts", 2009 International Image Sensor Workshop (IISW), session 02-02, Norway, Jun. 25-28, 2009

SUMMARY

In a solid-state image sensor having a plurality of photodiodes in one pixel, the width of the gate electrode of a transfer transistor for transferring the charge generated in the photodiode, the gate electrode being arranged adjacent to each photodiode in plan view, becomes small particularly when the pixel is miniaturized, thereby causing the problem that the capability of transferring the charge may be decreased.

Additionally, in association with the miniaturization of each pixel, the area occupied, in plan view, by a plurality of wires to be used for controlling the transfer transistor coupled to each of the photodiodes in the pixel becomes large. Accordingly, a problem is caused, in which the aperture ratio and sensitivity of the photodiode may be decreased.

Other purposes and new characteristics will become clear from the description and accompanying drawings of the present specification.

Of the preferred embodiments disclosed in the present application, outlines of the typical ones will be briefly described as follows.

In a semiconductor device according to one embodiment, a plurality of transfer transistors, which are respectively coupled to a plurality of photodiodes provided in a pixel, are controlled by gate electrodes, the number of which is smaller than that of the photodiodes.

Additionally, a manufacturing method of a semiconductor device according to one embodiment includes a step of forming a plurality of photodiodes and a plurality of transfer transistors coupled to the respective photodiodes, in which the transfer transistors are controlled by gate electrodes, the number of which is smaller than that of the photodiodes.

According to one embodiment disclosed in the present application, the performance of a semiconductor device can be improved. In particular, the imaging property of a solid-state image sensor can be improved.

DETAILED DESCRIPTION

Figure 1:
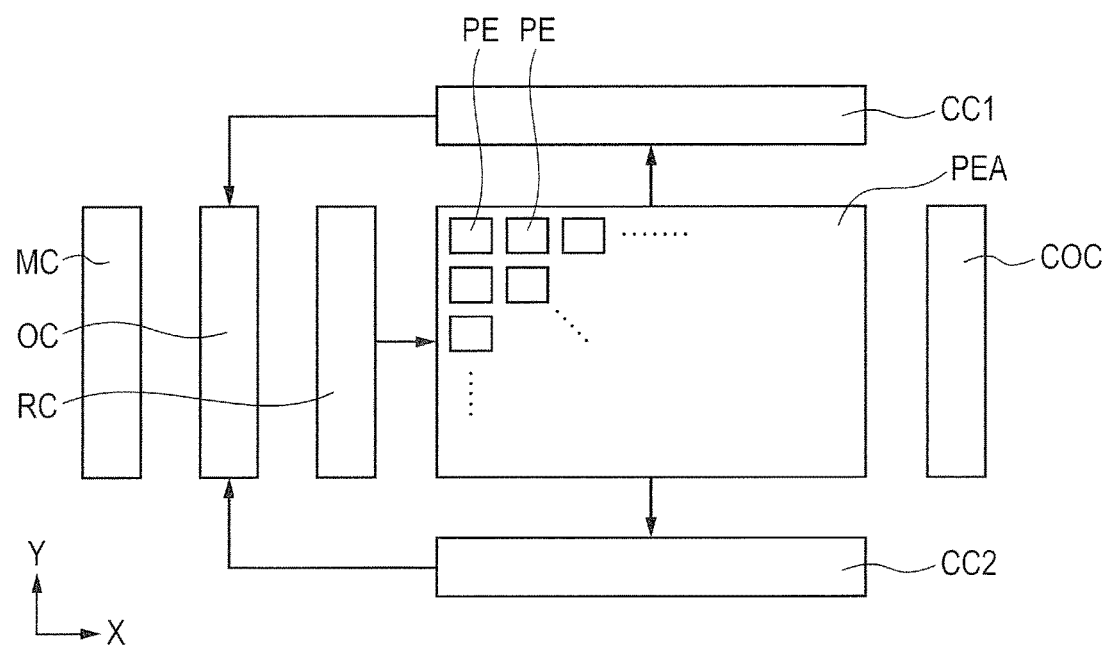
FIG. 1 is a schematic view illustrating a configuration of a semiconductor device according to First Embodiment of the present invention.

Hereinafter, preferred embodiments of the present invention will be described in detail based on the accompanying drawings. In each view for explaining the embodiments, components having the same function will be denoted with the same reference numerals, and duplicative description thereof will be omitted. Additionally, in the following embodiments, description of the same or similar parts will not be repeated in principle, unless it is particularly necessary.

In the following description, the case, where a well region in a pixel includes a p-type semiconductor region and a photodiode is formed by an n-type semiconductor region, will be described, but the case, where each of the well region and the photodiode has the opposite conductivity type, also has similar advantages. Additionally, in the following description, an element, in which light enters from the upper surface side of a solid-state image sensor, will be described as an example, but in a BSI (Back Side Illumination) type solid-state image sensor, predetermined advantages, which will be described later, can also be exhibited when a similar structure or process flow is used.

The symbols of "−" and "+" represent relative concentrations of impurities having an n-type or a p-type conductivity, and, for example, in the case of n-type impurities, impurity concentrations become larger in the order of "N$^-$", "N", and "N$^+$".

First Embodiment

Figure 2:
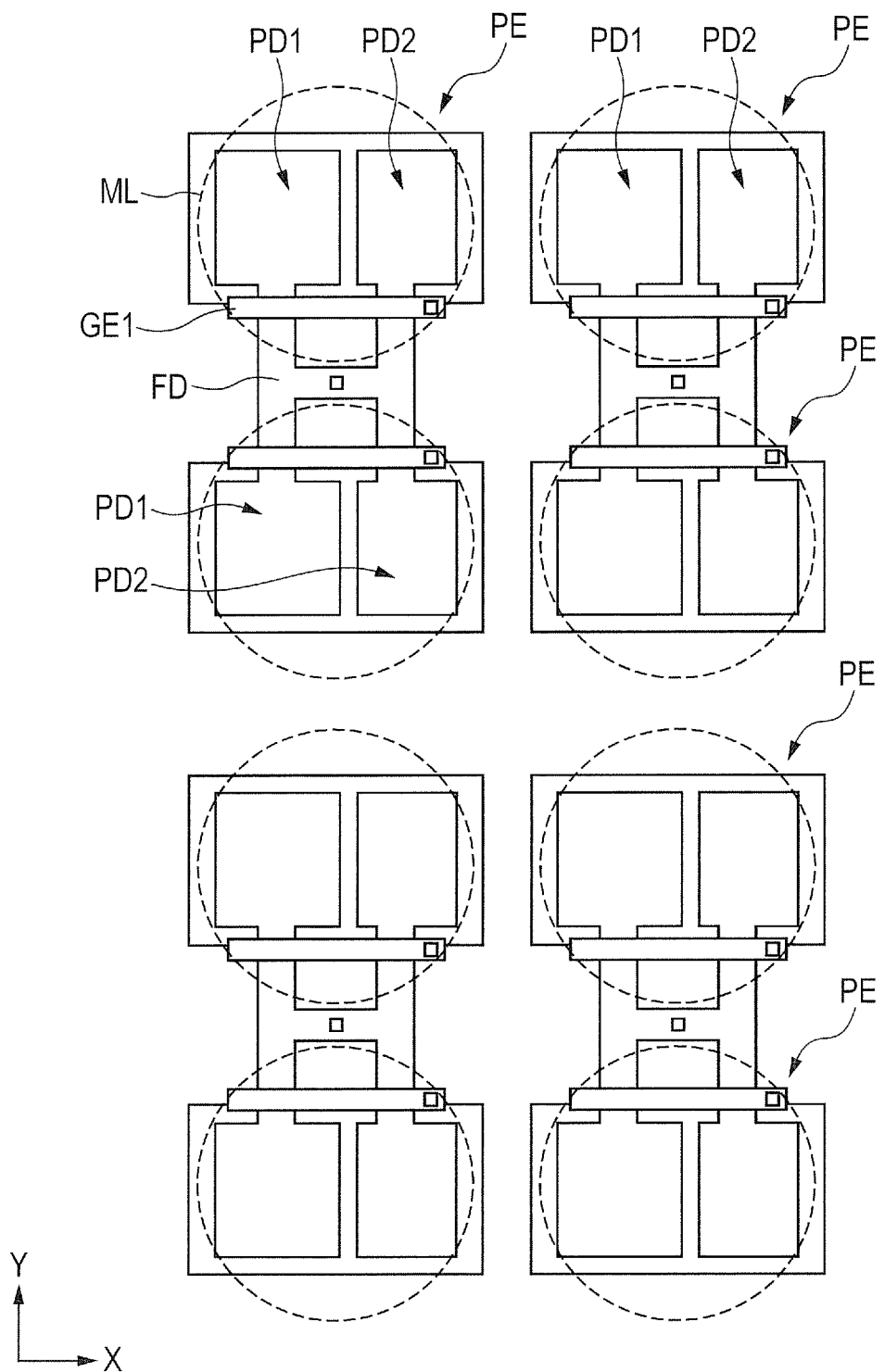
FIG. 2 is a plan view illustrating the semiconductor device according to First Embodiment of the invention.
Figure 3:
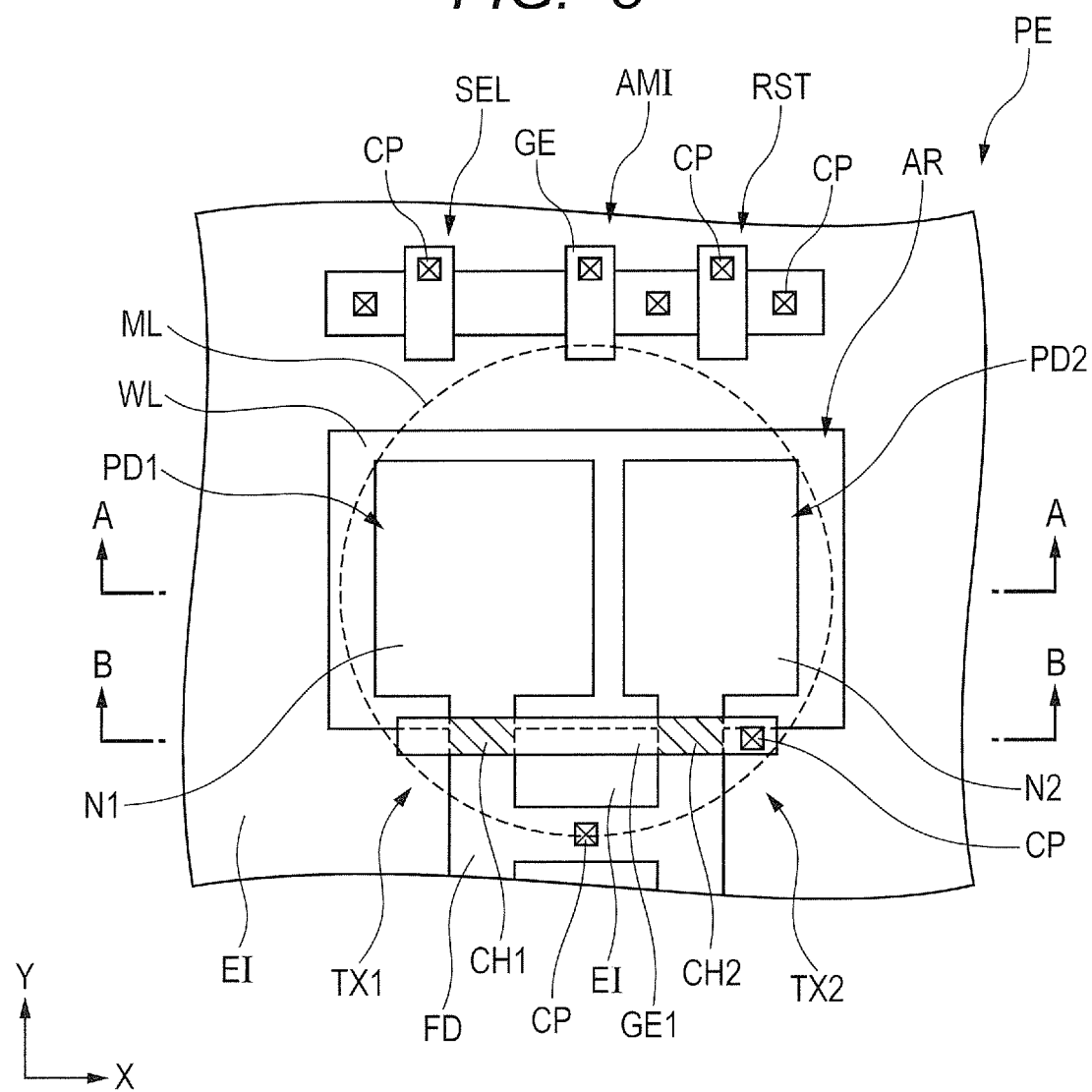
FIG. 3 is a plan view illustrating the semiconductor device according to First Embodiment of the invention.
Figure 4:
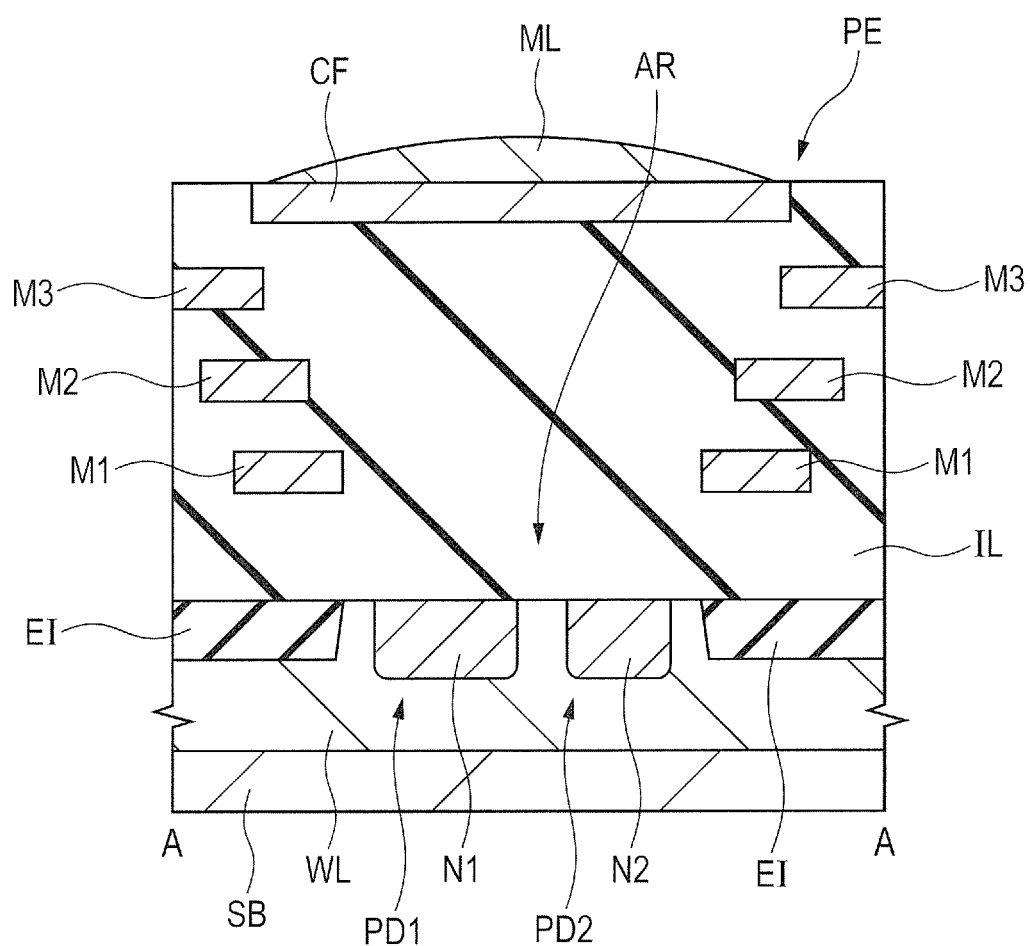
FIG. 4 is a sectional view taken along the line A-A in FIG. 3.
Figure 5:
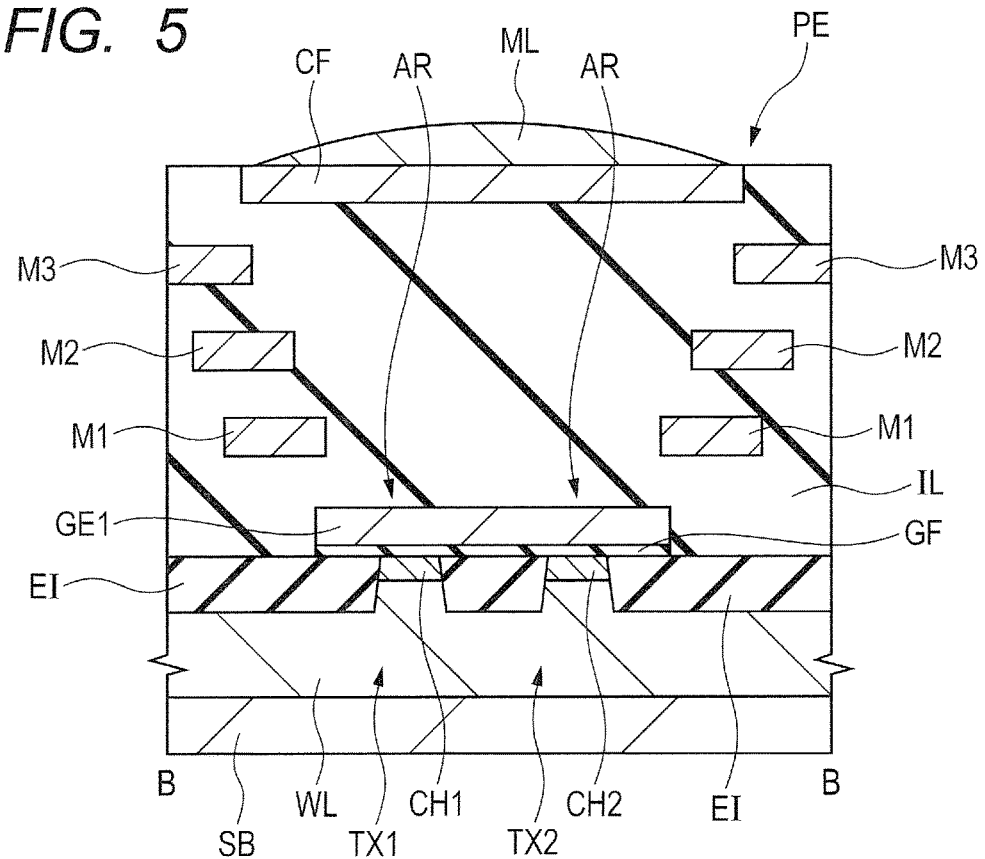
FIG. 5 is a sectional view taken along the line B-B in FIG. 3.

Hereinafter, a structure of a semiconductor device according to the present embodiment will be described with reference to FIGS. 1 to 6. FIG. 1 is a schematic view illustrating a configuration of the semiconductor device according to the embodiment. FIG. 2 is a plan view illustrating, in an enlarged manner, a plurality of pixels included in a solid-state image sensor that is the semiconductor device according to the embodiment. FIG. 3 is a plan view illustrating, in an enlarged manner, one pixel included in the solid-state image sensor that is the semiconductor device according to the embodiment. FIG. 4 is a sectional view taken along the line A-A in FIG. 3, FIG. 5 is a sectional view taken along the line B-B in FIG. 3.

Herein, a 4-transistor type pixel to be used as a pixel realizing circuit in a CMOS image sensor will be described as one example of the pixel, but the pixel should not be limited thereto. That is, in each pixel, both three transistors that are peripheral transistors and a transfer transistor are arranged around a light receiving part including two photodiodes. Herein, the peripheral transistors refer to a reset transistor, an amplifier transistor, and a select transistor.

A solid-state image sensor, which is a semiconductor device according to the present embodiment, is a CMOS (Complementary Metal Oxide Semiconductor) image sensor, and includes a pixel array part PEA, readout circuits CC1 and CC2, an output circuit OC, a row selection circuit RC, a control circuit COC, and a memory circuit MC, as illustrated in FIG. 1.

A plurality of pixels PE are arranged in a matrix pattern in the pixel array part PEA. That is, the pixels PE are arrayed in an X-axis direction and a Y-axis direction, which are oriented along a main surface of a semiconductor substrate that forms the solid-state image sensor, over the upper surface of the semiconductor substrate. The X-axis direction illustrated in FIG. 1 is a direction along the main surface of the semiconductor substrate that forms the solid-state image sensor, and is a direction along a raw direction in which the pixels PE are arrayed. On the other hand, the Y-axis direction, which is oriented along the main surface of the semiconductor substrate and intersects with the X-axis direction at right angles, is a direction along a column direction in which the pixels PE are arrayed. That is, the pixels PE are arranged to be arrayed in a matrix pattern.

Each of the pixels PE generates a signal in accordance with the intensity of emitted light. The row selection circuit RC selects the pixels PE in row units. Each of the pixels PE selected by the row selection circuit RC outputs the generated signal to the later-described output line OL (see FIG. 6). The readout circuits CC1 and CC2 are arranged to face each other in the Y-axis direction so as to interpose the pixel array part PEA therebetween. Each of the readout circuits CC1 and CC2 reads the signal output to the output line OL from the pixel PE, and outputs it to the output circuit OC. The memory circuit MC is a storage part for temporarily storing the aforementioned signal output from the output line OL.

The readout circuit CC1 reads the signals of half of the pixels PE, the half being near to the readout circuit CC1, while the readout circuit CC2 reads the signals of the remaining half of the pixels PE, the remaining half being near to the readout circuit CC2. The output circuit OC outputs the signals of the pixels PE, the signals having been read by the readout circuits CC1 and CC2, to the outside of the solid-state image sensor. The control circuit COC manages, in an integrated manner, the operations of the whole solid-state image sensor, and controls the operations of other components in the solid-state image sensor. The memory circuit MC is used for measuring the magnitude of the charge output from each of the two photodiodes in the pixel PE by storing the signal output from one of the two photodiodes.

FIG. 2 illustrates a layout in which eight pixels PE, each overlapping one microlens ML in plan view, are arrayed in the pixel array part PEA (see FIG. 1). That is, each pixel PE has one microlens ML. Herein, the outline of the microlens ML is illustrated by a dashed line. Of the pixels PE arrayed in the row and column directions, two pixels PE that are adjacent to each other in the column direction (Y-axis direction) are coupled to each other by an active region, as illustrated in FIG. 2. In other words, the two pixels PE share a floating diffusion capacitance part FD that is the drain region of the transfer transistor.

Two pixels PE, which are adjacent to each other in the Y-axis direction and share the floating diffusion capacitance part FD with each other, respectively have layouts line-symmetrical with each other with respect to, for example, an axis extending in the X-direction.

FIG. 3 illustrates one pixel PE overlapping one microlens ML in plan view, in the pixel array part PEA (see FIG. 1). Herein, the outline of the microlens ML is illustrated by a dashed line. Additionally, the outline of the active region overlapping a gate electrode GE1 in plan view and the outlines of semiconductor regions CH1 and CH2 are illustrated by dashed lines. Additionally, hatching lines are added to the regions where the semiconductor regions CH1 and CH2 are respectively formed, for easy understanding of the locations where the semiconductor regions CH1 and CH2 are respectively formed. FIG. 3 illustrates the photodiodes, transistors at the periphery thereof, and the like, but does not illustrate an interlayer insulation film, wires, a microlens, and the like, which are provided over them.

Most of the area of one pixel PE is occupied by the light receiving part including the photodiodes PD1 and PD2 formed over the upper surface of a semiconductor substrate SB (see FIG. 4). The peripheral transistors are arranged around the light receiving part, and the peripheries of an active region AR in the light receiving part and the respective active regions of the peripheral transistors are surrounded by an element isolation region EI. A reset transistor RST, an amplifier transistor AMI, and a select transistor SEL are peripheral transistors formed in the pixel PE.

The active region AR in the light receiving part has a rectangular shape in plan view. In the active region AR, the photodiodes PD1 and PD2 are arranged to be arrayed in the X-axis direction. The photodiodes PD1 and PD2 are formed to be spaced apart from each other, and each of them has a rectangular shape in plan view. However, the photodiodes PD1 and PD2 do not have areas equal to each other in plan view, and the area of the photodiode PD1 is larger than that of the photodiode PD2. Accordingly, the shapes of the photodiodes PD1 and PD2 are different from each other in plan view, and they are neither in a line-symmetrical relationship nor in a point-symmetrical relationship in the pixel PE.

Each peripheral transistor is formed in the same active region, and the active region extends in the X-axis direction along one side of the active region AR in the light receiving part. Additionally, a transfer transistor TX1 whose source region is the photodiode PD1 in the active region AR and a transfer transistor TX2 whose source region is the photodiode PD2 in the active region AR are formed along another side of the active region AR, to the side the peripheral transistors not being adjacent.

When turned to an on state, the transfer transistor TX1 transfers a charge L1 generated in the photodiode PD1 to the floating diffusion capacitance part FD. When turned to an on state, the transfer transistor TX2 transfers a charge R1 generated in the photodiode PD2 to the floating diffusion capacitance part FD.

Each peripheral transistor has a gate electrode GE extending in the Y-axis direction. Each of the transfer transistor TX1 and the transfer transistor TX2 has the gate electrode GE1 extending in the X-axis direction. A main characteristic of the present embodiment is that the respective transfer transistors TX1 and TX2 share one gate electrode GE1. Accordingly, the respective transfer transistors TX1 and TX2 are controlled by using the same wires electrically coupled to the gate electrode GE1. Each of the gate electrodes GE and GE1 includes, for example, polysilicon, and is formed over the semiconductor substrate via a gate insulation film GF (see FIG. 5). The gate electrode GE1 is adjacent to one side of the photodiode PD1 having a rectangular planar shape, and extends along the one side.

The floating diffusion capacitance part FD is formed in the active region AR. Because the floating diffusion capacitance part FD is in an electrically floating state, the charge stored therein is held unless the reset transistor RST is operated.

In the active region where the peripheral transistors are formed, the reset transistor RST, the amplifier transistor AMI, and the select transistor SEL are arranged to be sequentially arrayed in the X-axis direction. The reset transistor RST and the amplifier transistor AM1 share their drain regions. Additionally, the source region of the reset transistor RST is coupled to the drain region of the respective transfer transistors TX1 and TX2, i.e., to the floating diffusion capacitance part FD. The source region of the amplifier transistor AMI functions as the drain region of the select transistor SEL. The source region of the select transistor SEL is coupled to the output line OL (see FIG. 6).

All of the drain regions of the respective transfer transistors TX1 and TX2, the source region of the select transistor SEL, the source region of the reset transistor RST, and the drain region of the amplifier transistor AMI are $N^+$-type semiconductor regions formed over the main surface of the semiconductor substrate. Contact plugs CP are coupled to the upper surfaces of the respective semiconductor regions. Contact plugs CP are also coupled to the upper surfaces of the respective gate electrodes GE and GE1. A wire (not illustrated), formed over the semiconductor substrate via an interlayer insulation film (not illustrated), is coupled to the upper surface of each contact plug CP.

Although not illustrated, a substrate contact part, which is a semiconductor region to which a ground potential GND (see FIG. 6) is applied, is arranged over a main surface of a semiconductor substrate in each pixel PE so as to be exposed from the element isolation region EI. The potential of a well over the upper surface of the semiconductor substrate is fixed to 0 V by applying a ground potential to the substrate contact part via a contact plug, whereby a variation in the threshold voltage of the peripheral transistor can be prevented from occurring.

Each of the photodiode (first light receiving element) PD1 and the photodiode (second light receiving element) PD2, which are arrayed in the X-axis direction in the active region AR that is a light receiving part, is a semiconductor element extending in the Y-axis direction. That is, the longitudinal direction of each of the photodiodes PD1 and PD2 is oriented along the Y-axis direction.

As described later, the photodiode PD1 includes an n-type semiconductor region N1 formed over the main surface of the semiconductor substrate and a well region WL that is a p-type semiconductor region. Similarly, the photodiode PD2 includes an n-type semiconductor region N2 formed over the main surface of the semiconductor substrate and the well region WL. It can be considered that the photodiodes PD1 and PD2, which are the light receiving elements illustrated in FIG. 3, are respectively formed in the regions where the n-type semiconductor regions N1 and N2 are respectively formed. In the active region AR, the p-type well region WL is formed around each of the regions where the n-type semiconductor regions N1 and N2 are respectively formed, P-type impurities (e.g., B (boron)) are introduced into the well region WL.

The active region AR has a rectangular shape in plan view, but two protruding parts are formed at one of the four sides of the rectangular shape, the protruding parts being coupled together at the extended position. That is, the active region AR has a circular planar shape including these protruding parts and the rectangular pattern of the light receiving part. The element isolation region EI is formed inside the circular planar shape. The floating diffusion capacitance part FD, which is the drain region of the respective transfer transistors TX1 and TX2, is formed in these protruding parts. Additionally, one gate electrode GE1 is arranged to stretch directly over the two protruding parts.

N-type impurities (e.g., arsenic (As) or P (phosphorus)) are introduced into the respective n-type semiconductor regions N1 and N2. However, the impurity concentrations of the respective n-type semiconductor regions N1 and N2 are not equal to each other. The n-type impurity concentration of the n-type semiconductor region N1 is smaller than that of the n-type semiconductor region N2. Accordingly, the number of saturated electrons per unit volume of the photodiode PD1 is smaller than that of the photodiode PD2. Additionally, the depletion potential, required to completely transfer the potential in the photodiode PD1 by the transfer transistor TX1, is smaller than that required to completely transfer the potential in the photodiode PD2 by the transfer transistor TX2.

The widths in the X-axis direction of the n-type semiconductor regions N1 and N2 are different from each other. Although the lengths in the Y-axis direction of the respective n-type semiconductor regions N1 and N2 are equal to each other, the length in the X-axis direction of the n-type semiconductor region N1 is larger than that of the n-type semiconductor region N2. Accordingly, the areas of the n-type semiconductor regions N1 and N2 are not equal to each other, and the area of the n-type semiconductor region N1 is larger than that of the n-type semiconductor region N2.

The p-type semiconductor region CH1, into which p-type impurities (e.g., B (boron)) have been introduced, is formed in a region that is located: over the upper surface of the active region AR between the n-type semiconductor region N1 that forms the photodiode PD1 and the floating diffusion capacitance part FD; and over the upper surface of the semiconductor substrate directly under the gate electrode GE1. That is, the semiconductor region CH1 is formed in the channel region of the transfer transistor TX1.

The p-type semiconductor region CH2, into which p-type impurities (e.g., B (boron)) have been introduced, is formed in a region that is located: over the upper surface of the active region AR between the n-type semiconductor region N2 that forms the photodiode PD2 and the floating diffusion capacitance part FD; and over the upper surface of the semiconductor substrate directly under the gate electrode GE1. That is, the semiconductor region CH2 is formed in the channel region of the transfer transistor TX2. The p-type impurity concentrations of the respective semiconductor regions CH1 and CH2 is larger than that of the well region WL.

The p-type impurity concentration of the semiconductor region CH1 is smaller than that of the semiconductor region CH2. Accordingly, the threshold voltage of the transfer transistor TX1 is smaller than that of the transfer transistor TX2. That is, the transfer transistors TX1 and TX2 share the same gate electrode GE1, but the transfer transistor TX1 can only be turned to an on state while the transfer transistor TX2 is being maintained to be in an off state, by controlling the gate voltage to be applied to the gate electrode GE1 to be low.

Accordingly, it does not always happen that, when a potential is applied to the gate electrode GE1, both the transfer transistors TX1 and TX2 are necessarily turned to on states, so that the charges in the respective photodiodes PD1 and PD2 are transferred to the floating diffusion capacitance part FD. That is, the charge in the photodiode PD1 can only be transferred to the floating diffusion capacitance part FD by applying a predetermined potential to the gate electrode GE1; and thereafter the charge in the photodiode PD2 can be transferred thereto by applying a higher potential to the gate electrode GE1.

The value of a potential to be applied to the gate electrode GE1, at which the transfer transistor TX1 is turned on while the transfer transistor TX2 is not turned on, is larger than the depletion potential of the photodiode PD1 and smaller than that of the photodiode PD2. The value of a potential to be applied to the gate electrode GE1, at which the transfer transistor TX2 is turned on, is larger than the depletion potentials of the respective photodiodes PD1 and PD2.

Herein, when a potential is applied to the gate electrode GE1 in order to turn on the transfer transistor TX2, the transfer transistor TX1 is also turned to an on state; however, the charge in the photodiode PD1 has been completely transferred before that, and hence a potential is not transferred to the floating diffusion capacitance part FD from the photodiode PD1 even when the transfer transistor TX2 is turned on.

In the present embodiment, in the case where a plurality of photodiodes are formed in one pixel, the charge in each of the photodiodes can be individually transferred by using gate electrodes, the number of which is smaller than the number of the photodiodes in the pixel, as described above.

FIG. 4 is a sectional view taken along a direction in which the photodiodes PD1 and PD2 in one pixel PE are arrayed, the view including the photodiodes PD1 and PD2. In FIG. 4 and the sectional views to be used in the following description, the boundaries between a plurality of interlayer insulation films laminated over the semiconductor substrate SB are not illustrated.

As illustrated in FIG. 4, the p-type well region WL is formed over the upper surface of the semiconductor substrate SB including n-type single crystalline silicon, etc. The element isolation region EI for partitioning the active region AR and other active regions is formed over the well region WL. The element isolation region EI includes, for example, a silicon oxide film, and is embedded in a trench formed over the upper surface of the semiconductor substrate SB.

The n-type semiconductor regions N1 and N2 are formed to be spaced apart from each other over the upper surface of the well region WL. The well region WL that forms the n-type semiconductor region N1 and a pn junction functions as the anode of the photodiode PD1. The well region WL that forms the n-type semiconductor region N2 and a pn junction functions as the anode of the photodiode PD2. The n-type semiconductor region N1 and the n-type semiconductor region N2 are provided in one active region AR interposed between the element isolation regions EI.

Thus, both the photodiode PD1 including the n-type semiconductor region N1 and the well region WL and the photodiode PD2 including the n-type semiconductor region N2 and the well region WL are formed in the active region AR formed in the pixel. The photodiodes PD1 and PD2 in the active region AR are arranged to be arrayed so as to interpose the region, where the well region WL is exposed over the upper surface of the semiconductor substrate SB, therebetween.

The formation depths of the n-type semiconductor regions N1 and N2 are shallower than that of the well region WL. Additionally, the depth of the trench over the upper surface of the semiconductor substrate SB, the element isolation region EI being embedded in the trench, is shallower than the formation depths of the n-type semiconductor regions N1 and N2.

An interlayer insulation film IL is formed over the semiconductor substrate SB so as to cover the element isolation region EI and the photodiodes PD1 and PD2. The interlayer insulation film IL is a laminated film in which a plurality of insulation films are laminated. A plurality of wire layers are laminated in the interlayer insulation film IL, and wires M1 covered with the interlayer insulation film IL are formed in the lowermost wire layer. Wires M2 are formed over the wires M1 via the interlayer insulation film IL, and wires M3 are formed over the wires M2 via the interlayer insulation film IL. A color filter CF is formed above the interlayer insulation film IL, and the microlens ML is formed over the color filter CF. During the operation of the solid-state image sensor, light is emitted to the photodiodes PD1 and PD2 via the microlens ML and the color filter CF.

No wire is formed directly over the active region AR including the photodiodes PD1 and PD2. This is because the photodiodes PD1 and PD2 are prevented from not being irradiated by the light entering from the microlens ML being blocked with the wire. Also, occurrence of photoelectric conversion is prevented in the active region where the peripheral transistors, etc., are formed, by arranging the wires M1 to M3 in regions other than the active region AR.

Herein, the wires are illustrated on both right and left sides of FIG. 4, but one wire system is sufficient for controlling the transfer transistors TX1 and TX2 (see FIG. 3) in the pixel PE, because the transfer transistors TX1 and TX2 can be controlled by one gate electrode GE1 (see FIG. 3). That is, in order to separately transfer the charges in the respective photodiodes PD1 and PD2 by operating the transfer transistors TX1 and TX2, it is not necessary to provide two wires that are used for respectively controlling the transfer transistors TX1 and TX2 and are electrically insulated from each other.

Accordingly, for example, the wires M1 to M3 on the right side of the view are used for controlling the transfer transistors TX1 and TX2, and the wires M1 to M3 on the left side thereof can be used for another application. That is, the number of wires can be reduced in comparison with the case where the transfer transistors TX1 and TX2 are respectively controlled by separate wires that are insulated from each other.

FIG. 5 is a sectional view taken along a direction in which the gate electrode GE1 in one pixel PE is arrayed, the view including the gate electrode GE1 and the semiconductor regions CH1 and CH2. As illustrated in FIG. 5, the element isolation region EI for partitioning the active region AR and other active regions is formed over the well region WL. The gate electrode GE1 is formed, via the gate insulation film GF, over the main surface of the semiconductor substrate SB in the active region AR. The gate insulation film GF includes, for example, a silicon oxide film.

The semiconductor regions CH1 and CH2 are formed to be spaced apart from each other over the upper surface of the well region WL. A trench is formed over the main surface of the semiconductor substrate SB between the semiconductor regions CH1 and CH2, so that the element isolation region EI is formed in the trench. The upper surfaces of the respective semiconductor regions CH1 and CH2 that are spaced apart from each other are covered with the gate insulation film GF and one gate electrode GE1 over the gate insulation film GF. The formation depths of the semiconductor regions CH1 and CH2 are shallower than those of the n-type semiconductor regions N1 and N2 (see FIG. 4), and are shallower than the bottom surface of the element isolation region EI.

Figure 6:
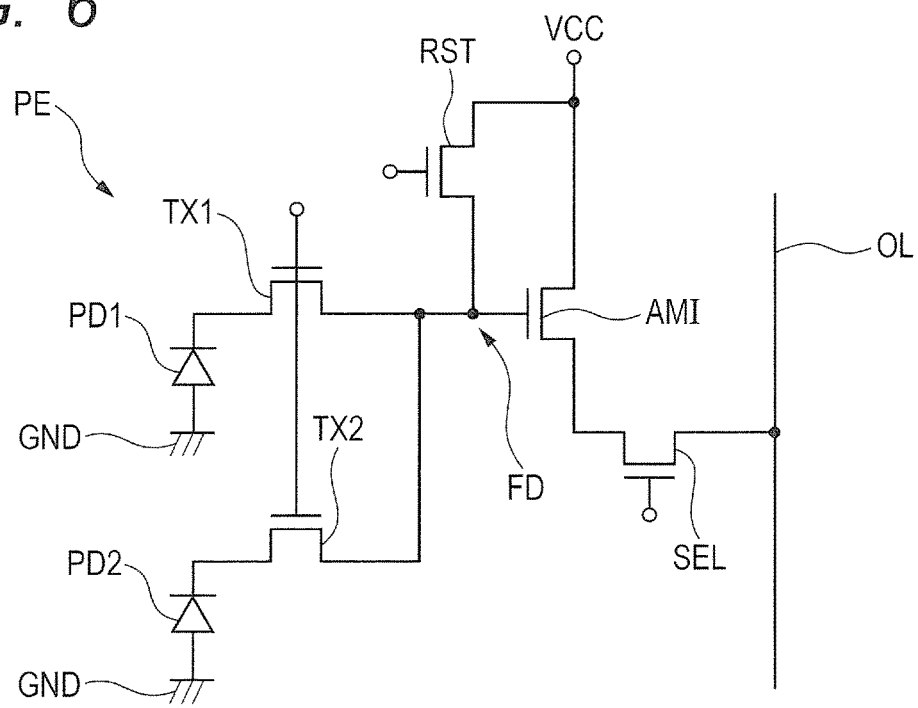
FIG. 6 is an equivalent circuit view illustrating the semiconductor device according to First Embodiment of the invention.

Subsequently, a circuit view of one pixel is illustrated in FIG. 6. FIG. 6 is an equivalent circuit view illustrating the semiconductor device according to the present embodiment. Each of the pixels PE illustrated in FIG. 1 has the circuit illustrated in FIG. 6. As illustrated in FIG. 6, the pixel has: the photodiodes PD1 and PD2 each performing photoelectric conversion; the transfer transistor TX1 for transferring the charge generated in the photodiode PD1; and the transfer transistor TX2 for transferring the charge generated in the photodiode PD2. The pixel also has: the floating diffusion capacitance part. FD for storing the charges transferred from the transfer transistors TX1 and TX2; and the amplifier transistor AMI for amplifying the potential of the floating diffusion capacitance part FD. The pixel further includes: the select transistor SEL for selecting whether the potential amplified by the amplifier transistor is output to the output line OL coupled to one of the readout circuits CC1 and CC2 (see FIG. 1); and the reset transistor RST for initializing the potentials of both the cathodes of the photodiodes PD1 and PD2 and the floating diffusion capacitance part FD to predetermined potentials. Each of the transfer transistors TX1 and TX2, the reset transistor RST, the amplifier transistor AMI, and the select, transistor SEL is, for example, an n-type MOS transistor.

The ground potential GND, a negative power source potential, is applied to the anodes of the respective photodiodes PD1 and PD2. The cathode of the photodiode PD1 is coupled to the source of the transfer transistor TX1, The cathode of the photodiode PD2 is coupled to the source of the transfer transistor TX2. The floating diffusion capacitance part FD, which is a charge detection part, is coupled to: the drains of the respective transfer transistors TX1 and TX2; the source of the reset transistor RST; and the gate of the amplifier transistor AMI.

A positive power source potential VCC is applied to the drain of the reset transistor RST and the drain of the amplifier transistor AMI. The source of the amplifier transistor AMI is coupled to the drain of the select transistor SEL. The source of the select transistor SEL is coupled to the output line OL coupled to one of the readout circuits CC1 and CC2.

Herein, the gate electrodes of the respective transfer transistors TX1 and TX2 are electrically coupled together. However, because the threshold voltage of the transfer transistor TX1 is smaller than that of the transfer transistor TX2, the transfer transistor TX1 can only be turned to an on state while the transfer transistor TX2 is being maintained to be in an off state, by controlling the gate voltage to be applied to the gate electrode GE1 to be relatively low. That is, the charges in the respective photodiodes PD1 and PD2 can be individually transferred to the floating diffusion capacitance part FD.

Subsequently, the operation of the semiconductor device according to the present embodiment will be described with reference to the circuit view of one pixel illustrated in FIG. 6. As the operation of a solid-state image sensor, an imaging operation and an auto focus operation can be cited.

The operation of the pixel to be carried out when imaging is performed will be first described. In this case, all of the transfer transistors TX1 and TX2 and the reset transistor RST are first turned to on states by applying predetermined potentials to the gate electrodes of the transfer transistors TX1 and TX2 and the reset transistor RST. Thereby, the charges remaining in the photodiodes PD1 and PD2 and the charge stored in the floating diffusion capacitance part FD flow toward the positive power source potential VCC, and the charge in each of the photodiodes PD1 and PD2 and the floating diffusion capacitance part FD is initialized. Thereafter, the reset transistor RST is turned to an off state.

Subsequently, the incident light is emitted to the pn junctions of the photodiodes PD1 and PD2, so that photoelectric conversion occurs in each of the photodiodes PD1 and PD2. As a result, the charge L1 is generated in the photodiode PD1, and the charge R1 is generated in the photodiode PD2. Thus, the photodiode PD1 and PD2 are light receiving elements in each of which a signal charge in accordance with the amount of incident light is generated therein by photoelectric conversion, i.e., the photodiode PD1 and PD2 are photoelectric conversion elements.

Subsequently, these charges are transferred to the floating diffusion capacitance part FD. In an imaging operation, the two photodiodes PD1 and PD2 in the pixel PE are operated by considering them as one photoelectric conversion part, and hence the charges in the respective photodiodes PD1 and PD2 are read by being synthesized into one signal. That is, in an imaging operation, the charge signals generated in the respective two photodiodes PD1 and PD2 are added and obtained as one piece of pixel information.

Accordingly, it is not necessary to separately read the charges in the respective photodiodes PD1 and PD2. Herein, the charges L1 and R1 are transferred to the floating diffusion capacitance part FD by applying a voltage, at which the gate electrode of the transfer transistors TX1 and TX2 is turned to an on state, to the gate electrode. Thereby, the floating diffusion capacitance part FD stores the charges transferred from the photodiodes PD1 and PD2. Thereby, the potential of the floating diffusion capacitance part FD is changed.

Subsequently, the changed potential of the floating diffusion capacitance part FD is amplified by the amplifier transistor AMI, and an electrical signal, corresponding to the change in the potential of the floating diffusion capacitance part FD, is output to the output line OL by turning the select transistor SEL to an on state. That is, the electrical signal output by the amplifier transistor AMI is output to the outside by operating the select transistor SEL. Thereby, one of the readout circuits CC1 and CC2 (see FIG. 1) reads the potential of the output line OL.

Subsequently, the operation of the pixel to be carried out when image surface phase difference auto focus is performed will be described. In the solid-state image sensor that is the semiconductor device according to the present embodiment, a plurality of photoelectric conversion parts (e.g., photodiodes) are provided in one pixel. The reason why the photodiodes are thus provided in a pixel is that, when the solid-state image sensor is used in a digital camera having, for example, an image surface phase difference auto focus detection system, the accuracy and speed of the auto focus can be improved.

In such a digital camera, when in focus, imaging outputs from one object become the same as each other in principle in respective two photodiodes in a pixel. On the other hand, when not in focus and out of focus, a gap is caused between the magnitude of a signal detected by one photodiode in a pixel and that of a signal detected by the other photodiode. In an image surface phase difference auto focus operation, auto focus can be achieved in a short time by calculating a drive amount of a lens required for auto focus from the amount of a gap between the signals obtained from two photodiodes, i.e., from a phase difference.

As described above, when a plurality of photodiodes are provided in a pixel, a larger number of fine photodiodes can be formed in the solid-state image sensor, and hence the accuracy of auto focus can be improved. Accordingly, in performing auto focus, it is necessary to separately read the charges generated in the respective photodiodes in the pixel, unlike the aforementioned imaging operation.

In an operation for auto focus detection, all of the transfer transistors TX1 and TX2 and the reset transistor RST are first turned to on states by applying predetermined potentials to the gate electrodes of them. Thereby, the charges in the photodiodes PD1 and PD2 and the floating diffusion capacitance part FD are initialized. Thereafter, the reset transistor RST is turned to an off state.

Subsequently, photoelectric conversion occurs in each of the photodiodes PD1 and PD2 with the pn junctions of them being irradiated with incident light. As a result, charges are generated in the respective photodiodes PD1 and PD2. That is, the charge L1 is generated in the photodiode PD1, and the charge R1 is generated in the photodiode PD2.

Subsequently, one of these charges is transferred to the floating diffusion capacitance part FD. Herein, the charge L1 in the photodiode PD1 is read to the floating diffusion capacitance part FD by turning on the transfer transistor TX1, thereby allowing the potential of the floating diffusion capacitance part FD to be changed. In this case, a potential is applied to the gate electrode shared by the transfer transistors TX1 and TX2, but it is necessary to apply a potential having a magnitude at which the transfer transistor TX1 is turned to an on state and the transfer transistor TX2 is not turned to on state.

Thereafter, the changed potential of the floating diffusion capacitance part FD is amplified by the amplifier transistor AMI, and then it is output to the output line OL by turning the select transistor SEL to an on state. That is, an electrical signal, corresponding to the change in the potential of the floating diffusion capacitance part FD that is a charge detection part, is amplified by the amplifier transistor AMI and is output. Thereby, one of the readout circuits CC1 and CC2 (see FIG. 1) reads the potential of the output line OL. The charge L1 thus read, i.e., a signal L1 is stored in the memory circuit MC (see FIG. 1).

At the time, the charge L1 generated in the photodiode PD1 remains in the floating diffusion capacitance part FD, and the potential of the floating diffusion capacitance part FD is being maintained at the changed one. The charge R1 in the photodiode PD2 is not yet transferred.

Subsequently, the charge R1 in the photodiode PD2 is read to the floating diffusion capacitance part FD by turning on the transfer transistor TX2, thereby allowing the potential of the floating diffusion capacitance part FD to be further changed. When the transfer transistor TX2 is turned on, the transfer transistor TX1 is also turned on, and hence the charges in both the photodiodes PD1 and PD2 can be synthesized and transferred. Herein, however, the charge L1 in the photodiode PD1 has been already transferred, and hence only the charge R1 in the photodiode PD2 is transferred to the floating diffusion capacitance part FD.

Thereby, in the floating diffusion capacitance part FD, a charge obtained by synthesizing the charge L1 in the photodiode PD1 that has been originally stored and the charge R1 in the photodiode PD2 that has been transferred thereafter is stored. That is, the charge of L1+R1 is stored in the floating diffusion capacitance part FD.

Thereafter, the changed potential of the floating diffusion capacitance part FD is amplified by the amplifier transistor AMI, and then it is output to the output line OL by turning the select transistor SEL to an on state. Thereby, one of the readout circuits CC1 and CC2 (see FIG. 1) reads the potential of the output line OL. In order to calculate the charge R1 generated in the photodiode PD2 from the charge of L1+R1 that has been thus read, the following calculation is performed. That is, the value of the charge L1 stored in the memory circuit MC (see FIG. 1) is subtracted from the value of the charge of L1+R1. Thereby, the charge R1 in the photodiode PD2 can be read. Such a calculation is performed, for example, in the control circuit COC (see FIG. 1).

Subsequently, an auto focus point is detected by calculating a drive amount of a lens required for focusing, from the amount of a gap between the signals L1 and R1 detected by the respective photodiodes PD1 and PD2 in each pixel PE in the pixel array part PEA (see FIG. 1), i.e., from a phase difference.

Alternatively, when the charges in the respective photodiodes PD1 and PD2 are sequentially read, as described above, a target to be read first may be the charge R1 in the photodiode PD2, and the charge L1 in the photodiode PD1 may be then read.

Alternatively, as another operation to be carried out when auto focus is performed, a method can be considered, in which an operation for calculating the charge R1 from the synthesized charge of L1+R1 is omitted. That is, the charge R1 in the photodiode PD2 can be independently read in the following way in which: the transfer transistor TX1 is first turned on such that the charge L1 is read and stored in the memory circuit MC; the floating diffusion capacitance part FD is reset by turning on the reset transistor RST; and the transfer transistor TX2 is then turned on. Also in this case, it is necessary to store the charge L1 into the memory circuit MC (see FIG. 1), but the charge L1 and the charge R1 can be independently read without performing a calculation as described above.

In the imaging operation and the auto focus operation, in particular, the operations of the transfer transistors TX1 and TX2 are different from each other, as described above. In the auto focus operation, it is necessary to sequentially turn the transfer transistors TX1 and TX2 to on states, but in the imaging operation, it is only necessary to turn both the transfer transistors TX1 and TX2 to on states.

When the solid-state image sensor according to the present embodiment is used in a digital camera, the aforementioned imaging operation is performed in capturing either a still picture or a moving picture. In capturing a moving picture, the auto focus operation is performed in each pixel, along with the imaging operation.

Figure 31:
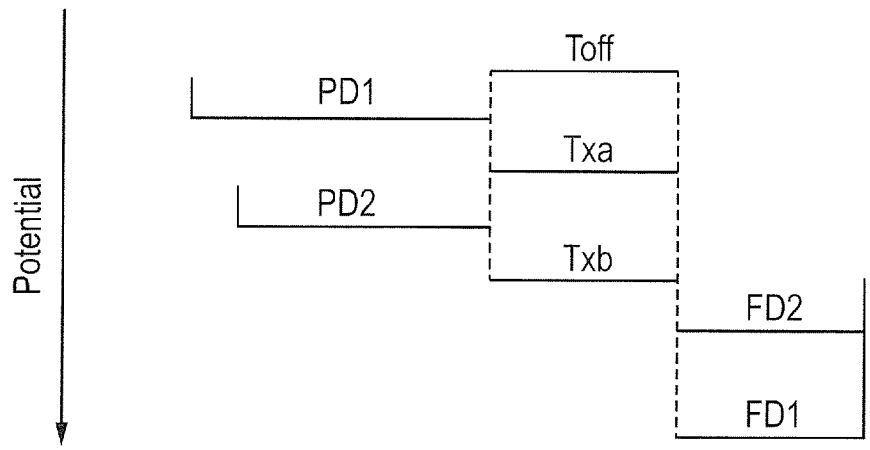
FIG. 31 is a potential structure view illustrating a transfer operation of the semiconductor device according to First Embodiment of the invention.

Subsequently, a transfer operation in the semiconductor device according to the present embodiment will be described with reference to the potential structure view illustrated in FIG. 31. FIG. 31 is a potential structure view illustrating a transfer operation in the semiconductor device according to the embodiment. In FIG. 31, a potential is deeper when located at a lower position of the view than when located at an upper portion. That is, the vertical axis in the view represents a potential, and a potential is lower when located at a lower position of the view. In other words, the voltage set value of a potential is larger when located at a lower position of the view.

Potentials occurring when charges are stored in the respective photodiodes PD1 and PD2 are illustrated on the left side of the view. Potentials occurring when the transfer transistors TX1 and TX2 (see FIG. 3) are in on states and in off states are illustrated in the middle of the view. Potentials occurring in the floating diffusion capacitance parts to which charges have been transferred are illustrated on the right side of the view. Herein, the potentials of the photodiodes PD1 and PD2 refer to the voltages necessary for completely transferring the charges stored in the respective photodiodes PD1 and PD2, i.e., to depletion potentials.

As illustrated in FIG. 31, when the transfer transistor TX1 (see FIG. 3) is in an off state even if a charge is stored in the photodiode PD1, the potential Toff thereof is higher than the potential of the photodiode PD1, and hence the potential Toff serves as a barrier, so that the charge does not move toward the floating diffusion capacitance part. That is, in order to transfer a charge to the floating diffusion capacitance part from the photodiode PD1 by turning on the gate electrode of the transfer transistor TX1, it is necessary to set a threshold voltage such that the gate electrode is turned on by a potential, which is lower than the depletion potential set for the photodiode PD1, directly under the gate electrode.

Herein, the potential Txa of the transfer transistor TX1 becomes lower than that of the photodiode PD1 when the transfer transistor TX1 is turned to an on state, and hence the charge stored in the photodiode PD1 moves to the floating diffusion capacitance part, so that the charge is stored therein as a potential FD1.

However, the impurity concentration of the n-type semiconductor region N2 (see FIG. 3) that forms the photodiode PD2 is larger than that of the n-type semiconductor region N1 (see FIG. 3) that forms the photodiode PD1, and hence the potential of the photodiode PD2 is lower than the potential of the photodiode PD1 and the potential Txa of the transfer transistor TX1 in an on state. Accordingly, the charge in the photodiode PD2 does not move to the floating diffusion capacitance part even when the transfer transistor TX1 is turned on.

Subsequently, when the transfer transistor TX2 is turned to an on state, the potential Txb becomes deeper than the potential of the photodiode PD2, and hence the charge stored in the photodiode PD2 moves to the floating diffusion capacitance part, so that the charge is stored therein as a potential FD2.

Herein, the potential FD2 is a potential in a state where the charge in the photodiode PD1 and that in the photodiode PD2 are stored in the floating diffusion capacitance part. When the potential FD2 becomes higher than the potential Txb, all of the charges in the photodiodes PD1 and PD2 cannot be transferred to the floating diffusion capacitance part. Accordingly, the floating diffusion capacitance part is required to have a potential depth to the extent in which the charges in both the photodiodes PD1 and PD2 can be held. The potential depth of the floating diffusion capacitance part can be adjusted by the concentration of the n-type impurities to be introduced thereinto. However, from the viewpoint of preventing occurrence of noise, it is preferable that the area of the floating diffusion capacitance part FD (see FIG. 3) is as small as possible and also the potential depth is shallower.

As described above, it is possible that, after the charge in the photodiode PD1 is transferred to the floating diffusion capacitance part, the charge in the photodiode PD2 is added thereto, but it may be possible that: after the charge in the photodiode PD1 is transferred to the floating diffusion capacitance part and is read, the charge in the floating diffusion capacitance part is once reset; and then the charge in the photodiode PD2 is transferred to the floating diffusion capacitance part.

Figure 29:
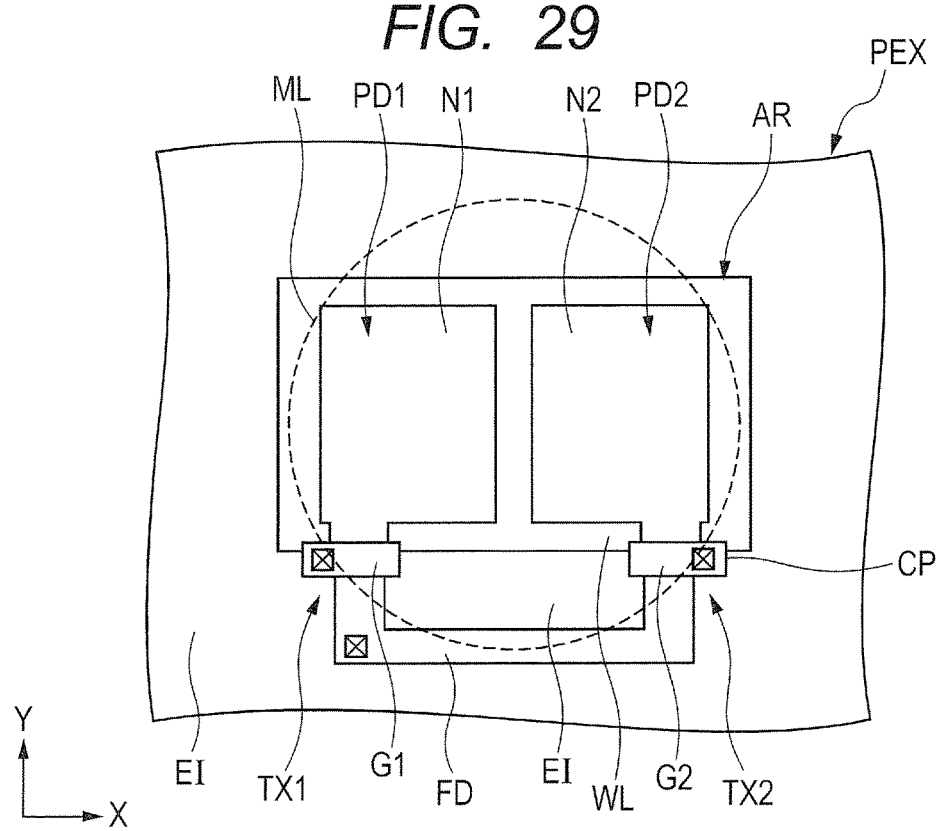
FIG. 29 is a plan view illustrating a semiconductor device of a comparative example.

Subsequently, advantages of the semiconductor device according to the present embodiment will be described by using the comparative example illustrated in FIG. 29. FIG. 29 is a plan view illustrating a pixel that forms a semiconductor device of a comparative example.

In a pixel PEX illustrated in FIG. 29, a gate electrode G1 of a transfer transistor TX1 and a gate electrode G2 of a transfer transistor TX2 are provided separately, and the semiconductor regions CH1 and CH2 (see FIG. 3) are not formed. Additionally, n-type semiconductor regions N1 and N2 respectively have layouts line-symmetrical with each other, and the impurity concentrations of the respective n-type semiconductor regions N1 and N2 are equal to each other. In the pixel PEX of the comparative example, other structures, except the aforementioned characteristics, are similar to the structures of the pixel PE according to the present embodiment described with reference to FIG. 3, etc.

That is, in the comparative example, the areas of the respective n-type semiconductor regions N1 and N2 are equal to each other, and the depletion potentials of the respective photodiodes PD1 and PD2 are equal to each other, and the threshold voltages of the respective transfer transistors TX1 and TX2 are equal to each other. Herein, separate wires (not illustrated) are coupled to the upper surfaces of the respective gate electrodes G1 and G2 via contact plugs CP. Accordingly, potentials can be respectively applied to the gate electrodes G1 and G2 at separate timings by using the two wire systems, and hence the transfer transistors TX1 and TX2 can be controlled individually.

In a solid-state image sensor having the pixel PEX of such a comparative example, problems as described below are caused.

That is, in a solid-state image sensor having two photodiodes in one pixel, it is necessary to provide two transfer transistors coupled to the respective photodiodes. In this case, it can be considered that the gate electrodes G1 and G2, which form the respective two transfer transistors TX1 and TX2 and which are electrically insulated from each other, are formed, as in the pixel PEX of the comparative example illustrated in FIG. 29. In this case, it is necessary to provide a wire (not illustrated) for controlling the gate electrode G1 and a wire (not illustrated) for controlling the gate electrode G2.

When the semiconductor device of the comparative example is a solid-state image sensor in which the light emitted from the side of the main surface of a semiconductor substrate is received (Front Side Illumination type solid-state image sensor), it is necessary to form the wires at positions where the wires do not overlap, in plan view, a light receiving part in a pixel, i.e., form directly over a region between pixels arrayed in a pixel array part, in order that emitted light is prevented from being blocked by the wires.

When the two photodiodes PD1 and PD2 are thus provided in the pixel PEX, the number of transfer transistors doubles in comparison with the case where only one photodiode is provided in a pixel. Additionally, when the two transfer transistors TX1 and TX2 are intended to be controlled by the two gate electrodes G1 and G2 isolated from each other, the number of control wires for the transfer transistors also doubles in comparison with the case where only one photodiode is provided in a pixel.

Herein, it is necessary to secure a region where the control wires are to be arranged, but when the wires are arranged directly over the light receiving part, a problem is caused, in which sensitivity may be decreased, and hence the control wires are required to be arranged between adjacent pixels PEX. Accordingly, when the two transfer transistors TX1 and TX2 are controlled by the two gate electrodes G1 and G2 isolated from each other, a problem is caused, in which it may become difficult to reduce the space between two of a plurality of pixels.

Additionally, a problem in which power consumption may be increased due to an increase in wires; a problem in which light may be blocked by the wires; and the like, are caused. When incident light is blocked by increased wires, the amount of light to be emitted to the photodiodes PD1 and PD2 is decreased, and hence a problem is caused, in which the sensitivity of the pixel PEX may be decreased due to a decrease in the aperture ratio of the light receiving part in the pixel PEX. Additionally, when light is blocked by wires, it becomes difficult to accurately detect the amount of a gap between the signals obtained from the respective photodiodes PD1 and PD2, in an image surface phase difference auto focus operation, and hence a problem is caused, in which the speed and accuracy of auto focus may be decreased.

Additionally, in a solid-state image sensor having the photodiodes PD1 and PD2 in one pixel PEX, as in the comparative example, it can be considered that the widths in the X-axis direction of the respective gate electrodes G1 and G2, which are arranged adjacent to the respective photodiodes PD1 and PD2 and are isolated from each other, may be decreased. In this case, because the widths of the respective gate electrodes G1 and G2 are small, there is the fear that the capability of transferring the aforementioned charges in the photodiodes by using the transfer transistors may de decreased.

In a relatively small digital camera, the area of a pixel in a solid-state image sensor is small and it is required to make the space between the pixels small, and hence the above problems particularly become remarkable. Even in the case of a BSI type solid-state image sensor, a problem is caused, in which a charge-discharge current may be increased due to an increase in control wires, thereby increasing power consumption.

On the other hand, in the semiconductor device according to the present embodiment, the gate electrodes of the respective transfer transistors TX1 and TX2, which are coupled to the respective photodiodes PD1 and PD2 in one pixel PE, are formed by one gate electrode GE1, as illustrated in FIG. 3. Accordingly, the transfer transistors TX1 and TX2 can be operated by using one control wire. The one control wire described herein refers to one wire system, including multiple-layer wires electrically coupled together through a via, etc., not to one-layer wires formed in a predetermined layer.

That is, the respective numbers of photodiodes and transfer transistors in a pixel double in the present embodiment, in comparison with a solid-state image sensor in which only one photodiode is formed in a pixel; however, an increase in control wires for the transfer transistors can be prevented. Accordingly, an increase in the number of wires can be prevented, and hence it becomes easy to reduce the space between adjacent pixels while occurrence of light blocking by wires is being prevented.

Accordingly, the sensitivity property of a pixel can be prevented from being deteriorated in a Front Side Illumination type solid-state image sensor. Further, the space between pixels can be reduced, and hence the miniaturization of a semiconductor device, the higher pixel density in a solid-state image sensor, an increase in the aperture ratio of a light receiving part, and an improvement in the sensitivity property of a pixel can be achieved. Furthermore, an increase in the power consumption of a solid-state image sensor can be prevented by preventing an increase in the number of wires. Accordingly, the performance of a semiconductor device can be improved. In a BSI type solid-state image sensor, an increase in power consumption can be prevented.

Additionally, it can be made possible in the present embodiment that: a configuration is adopted, in which the number of the gate electrodes of transfer transistors is small with respect to the number of photodiodes; and charges in the respective two photodiodes in a pixel are read separately from each other. This can be achieved by forming the semiconductor regions CH1 and CH2, the impurity concentrations of which are different form, each other, in the channel regions of the respective transfer transistors TX1 and TX2 illustrated in FIG. 3, thereby creating a difference between the magnitudes of the threshold voltages of the respective transfer transistors TX1 and TX2. Accordingly, the charges in the respective photodiodes PD1 and PD2 can be sequentially detected by controlling the potential to be applied to the gate electrode GE1.

Additionally, in a solid-state image sensor having the photodiodes PD1 and PD2 in the pixel PE, the gate electrode GE1 adjacent to the photodiodes PD1 and PD2 extends without being divided, and hence the widths in the X-axis direction of the gate electrode GE1 of the respective transfer transistors TX1 and TX2 can be prevented from being decreased. Accordingly, the capability of transferring the charges in the respective photodiodes PD1 and PD2 by using the transfer transistors TX1 and TX2 can be prevented from being decreased.

Herein, when the threshold voltages of the respective two transfer transistors in the pixel are different from each other, there may be the case where the depletion potentials of the respective two photodiodes are required to be changed in order to completely transfer the charges in the respective photodiodes. So, in the present embodiment, the n-type impurity concentration of the n-type semiconductor region N1 is set to be smaller than that of the n-type semiconductor region N2.

Accordingly, the number of saturated electrons per unit volume of the photodiode PD1 is smaller than that of the photodiode PD2, and the depletion potential of the photodiode PD1 is smaller than that of the photodiode PD2. Thereby, when the charges in the respective photodiodes PD1 and PD2 are intended to be transferred, the charges can be prevented from remaining in the photodiodes PD1 and PD2, because the threshold voltages of the respective transfer transistors TX1 and TX2 are different from each other. That is, the speed and accuracy of focusing can be prevented from being decreased, such decreases being caused because it becomes difficult to accurately detect charge signals with reset noise, etc., being generated.

However, when there is a difference between the numbers of charges (numbers of saturated electrons) to be stored in respective two photodiodes, the charges having been generated by photoelectric conversion, the amounts of charges obtained from the photodiodes are different from each other, even when in focus. Accordingly, in order to accurately perform auto focus, it can be considered that correction is performed in view that there is a difference between the numbers of saturated electrons of the respective two photodiodes, in which, for example, a charge signal obtained from a photodiode whose number of saturated electrons is smaller is amplified to a relatively large level such that the magnitudes of the charge signals obtained from the photodiodes become equal to each other when in focus. It is not preferable to perform such, correction from the viewpoint of achieving an improvement in the accuracy of charge detection, a reduction in the manufacturing cost of a solid-state image sensor, a reduction in the power consumption of a solid-state image sensor, and an improvement in the operating speed of a solid-state image sensor.

So, in the present embodiment, the area of the photodiode PD1 obtained in plan view is made larger than that of the photodiode PD2 obtained in plan view. By thus creating differences between the areas and shapes of the photodiodes PD1 and PD2, the numbers of saturated electrons of the photodiodes PD1 and PD2 can be made equal to each other, while the numbers of saturated electrons per unit volume thereof are being maintained to be different from each other.

When the charges in the two photodiodes PD1 and PD2 are transferred by using one gate electrode GE1, as described above, it is not always necessary to adopt all the configurations with respect to the photodiodes PD1 and PD2, the configurations including: a difference is created between the p-type impurity concentrations of the channel regions; a difference is created between the n-type impurity concentrations; and a difference is created between the areas.

That is, even if the semiconductor regions CH1 and CH2, the p-type impurity concentrations of which are different from each other, are not provided, for example, there may be the case where a difference is generated between the threshold voltages of the respective transfer transistors TX1 and TX2, when the areas or the n-type impurity concentrations of the photodiodes PD1 and PD2 are different from each other. Additionally, even if a difference is not created between the n-type impurity concentrations of the respective photodiodes PD1 and PD2, there may be the case where the charges in the respective photodiodes PD1 and PD2 can be completely transferred, or where, even if they cannot be completely transferred, the charges remaining in the photodiodes PD1 and PD2 are small to an extent in which they can be neglected. In these cases, there may be the case: where it is not necessary to create a difference between the n-type impurity concentrations of the respective photodiodes PD1 and PD2; or where it is not necessary to create a difference between the areas of the respective photodiodes PD1 and PD2.

However, it is difficult to accurately control the threshold voltages of the respective transfer transistors TX1 and TX2 by creating a difference between the areas of the respective photodiodes PD1 and PD2 without forming the semiconductor regions CH1 and CH2. That is, the areas of the respective photodiodes PD1 and PD2 are large, and hence it is difficult to obtain desired threshold voltages of the transfer transistors TX1 and TX2 by forming many TEGs (Test Element Groups) in a partial region of a solid-state image sensor.

On the other hand, when the semiconductor regions CH1 and CH2 are formed, the threshold voltages of the transfer transistors TX1 and TX2 are determined by the concentrations of the semiconductor regions. Accordingly, in the semiconductor regions CH1 and CH2 not having large areas, unlike the photodiodes PD1 and PD2, it is easy to form many TEGs in a partial region of the solid-state image sensor, and hence it is easy to set the threshold voltages to desired values.

Figure 7:
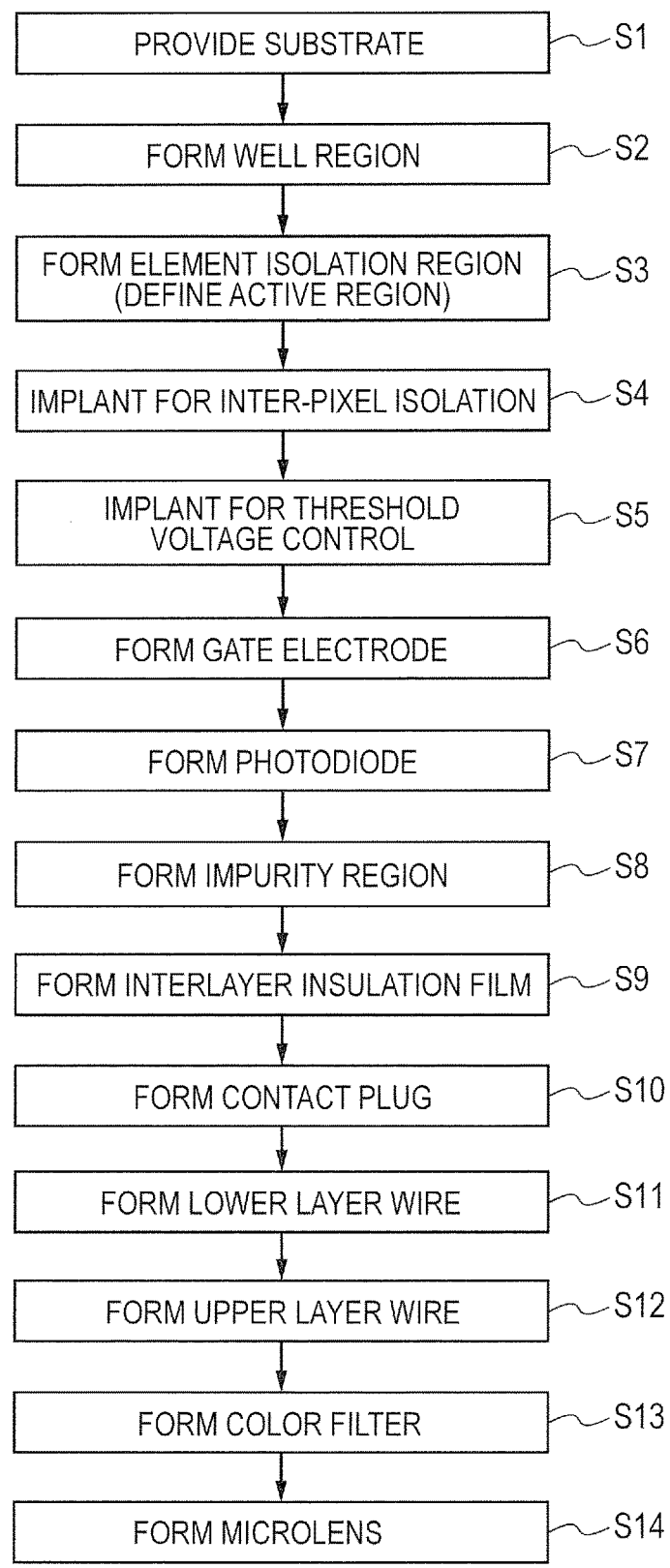
FIG. 7 is a view illustrating a flow of manufacturing steps of the semiconductor device according to First Embodiment of the invention.

Hereinafter, a manufacturing method of a semiconductor device according to the present embodiment will be described with reference to FIGS. 7 to 24. FIG. 7 is a view illustrating a flow of manufacturing steps of a semiconductor device according to the embodiment. Each of FIGS. 8, 10, 12, 14, 16, 18, 22, and 24 is a sectional view for explaining a manufacturing step of a semiconductor device according to the embodiment. Each of FIGS., 9, 11, 13, 15, 17, 19 to 21, and 23 is a plan view for explaining a manufacturing step of a semiconductor device according to the embodiment.

Herein, a 4-transistor type pixel to be used as a pixel realizing circuit in a CMOS image sensor will be described as one example of a pixel, but the pixel should not be limited thereto. Hereinafter, description will be made by using plan views in each of which, of components in a pixel, the peripheral transistor, and the like, are omitted and only the photodiode and the floating diffusion capacitance part are mainly depicted.

Each of FIGS. 10, 18, 22, and 24 is a view illustrating the section taken along the line A-A in each of FIGS. 9, 17, 19, and 23. Each of FIGS. 12, 14, and 16 is a view illustrating the section taken along the line B-B in each of FIGS. 11, 13, and 15. In the plan views to be used in the following description, interlayer insulation films and photoresist films are not illustrated.

Figure 8:
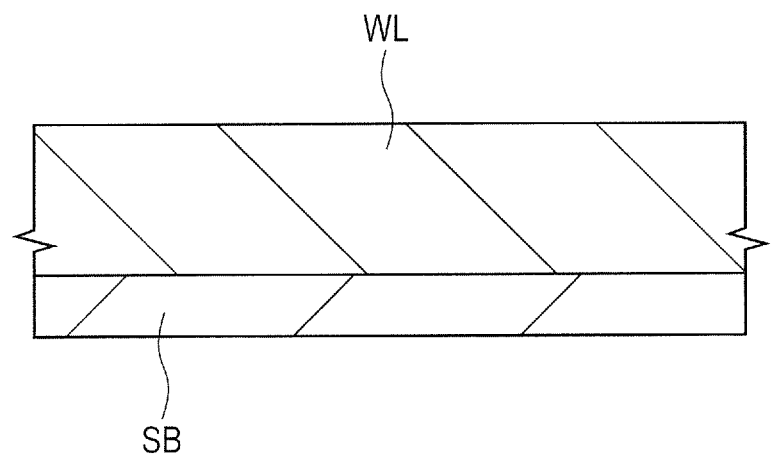
FIG. 8 is a sectional view for explaining a manufacturing step of the semiconductor device according to First Embodiment of the invention.

As illustrated in FIG. 8, the semiconductor substrate SB is first provided (Step S1 in FIG. 7). The well region WL is then formed over the upper surface of the semiconductor substrate SB (Step S2 in FIG. 7). The semiconductor substrate SB includes, for example, single crystalline silicon (Si). The well region WL is formed by introducing p-type impurities (e.g., B (boron)) into the main surface of the semiconductor substrate SB with the use of an ion implantation process, or the like. The well region WL is a p-type semiconductor region having a relatively low impurity concentration.

Figure 9:
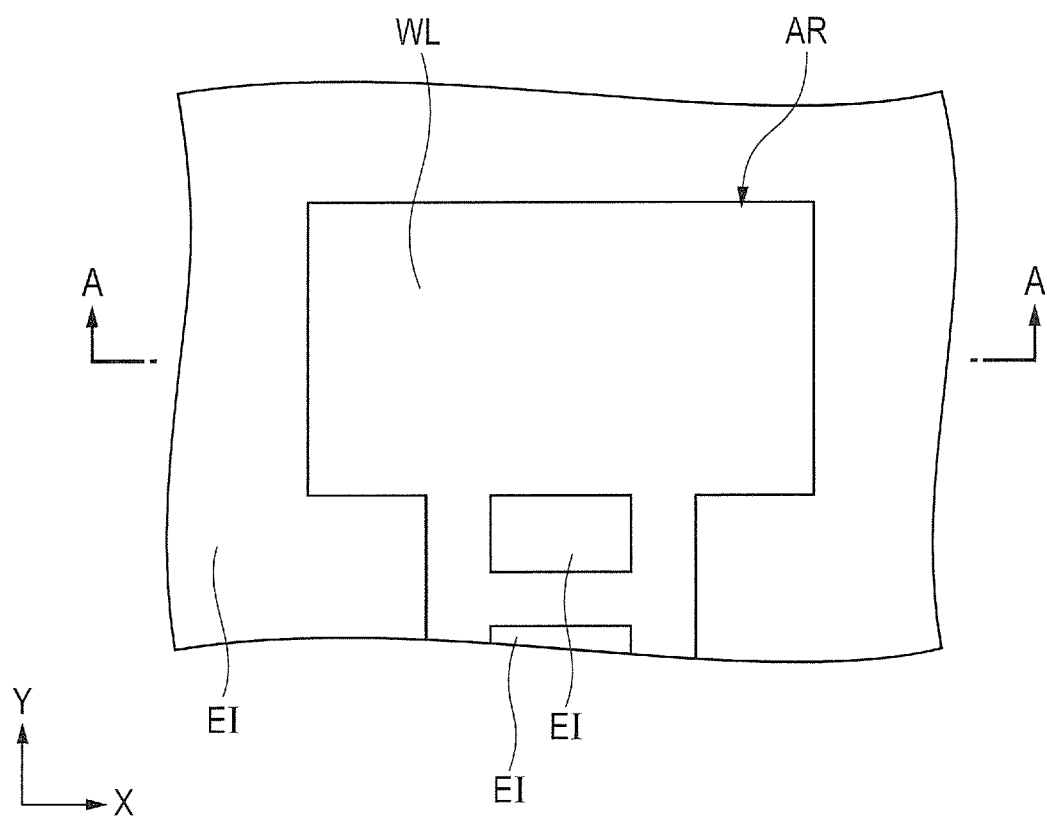
FIG. 9 is a plan view for explaining a manufacturing step of the semiconductor device, following FIG. 8.
Figure 10:
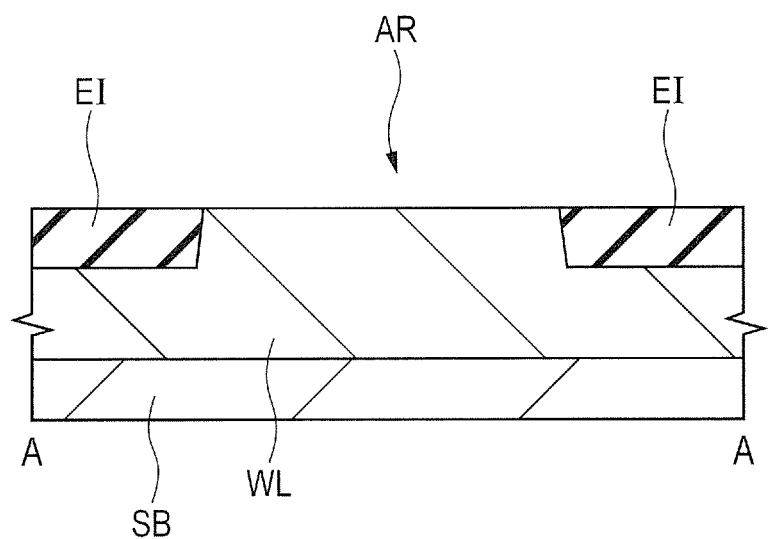
FIG. 10 is a sectional view for explaining the manufacturing step of the semiconductor device, following FIG. 8.

Subsequently, a trench is formed in the main surface of the semiconductor substrate SB, so that the element isolation region EI is formed in the trench (Step S3 in FIG. 7), as illustrated in FIGS. 9 and 10. Thereby, a region where the upper surface of the semiconductor substrate SIB is exposed from the element isolation region EI, i.e., an active region is defined (partitioned). The element isolation region EI can be formed, for example, by an STI (Shallow Trench Isolation) process, a LOCOS (Local Oxidation of Silicon) process, or the like. Herein, the element isolation region EI is formed by an STI process. The well region WL is formed over the whole upper surface of the semiconductor substrate in the active region AR.

Herein, a case will be described in which the active region AR is defined after the well region WL is formed, but conversely the well region WL may be formed after the element isolation region EI is formed. In that case, the well region WL is formed by implanting p-type impurities with accelerating energy at which the active region AR and the element isolation region EI can be penetrated. As illustrated in FIG. 10, the formation depth of the element isolation region EI is shallower than the bottom of the well region WL.

Additionally, the active region AR surrounded by the element isolation region EI has: a region where a light receiving part including two photodiodes will be formed in a later step; and a region where a floating diffusion capacitance part, which is the drain region of a transfer transistor and a region where a charge is stored, will be formed, as illustrated in FIG. 9. The region where the light receiving part will be formed has a rectangular shape in plan view, and both the ends of the region where the floating diffusion capacitance part will be formed contact one of four sides of the region where the light receiving part will be formed. That is, the active region AR has a cyclic structure including the aforementioned two regions, and the element isolation region EI is formed in a place surrounded by the two regions.

In other words, the region where the floating diffusion capacitance part, will be formed has a shape in which two patterns, which protrude toward the element isolation region EI from two places at the aforementioned one side of the region where the light receiving part will be formed, are coupled together outside the region where the light receiving part will be formed.

Herein, the two protruding patterns, which are the regions where the floating diffusion capacitance part will be formed, are coupled together, but the two protruding patterns may not be coupled together. In this case, the active region AR does not have a cyclic structure.

Herein, each of the two protruding patterns, which are the regions where the floating diffusion capacitance part will be formed, extends toward the bottom of the view and is coupled to the region where the floating diffusion capacitance part in another pixel will be formed; but the regions, where the floating diffusion capacitance parts in respective adjacent pixels are formed, may not be coupled together.

Although not illustrated, implantation of impurities for isolating later-formed photodiodes from each other, i.e., inter-pixel isolation implantation is then performed (Step S4 in FIG. 7). Specifically, a pixel isolation region (not illustrated), which is a $p^+$-type semiconductor region, is formed over the upper surface of the semiconductor substrate SB by implanting p-type impurities (e.g., B (boron)) into a region with the use of an ion implantation process, or the like, the region surrounding a region located over the upper surface of the semiconductor substrate SB and in the surrounded region a photodiode being to be formed.

Herein, the pixel isolation region is formed in a region that overlaps the element isolation region EI in plan view. The pixel isolation region is formed more deeply than an n-type semiconductor region that forms a later-formed photodiode. Herein, the pixel isolation region is formed from the interface between the bottom surface of the element isolation region EI and the upper surface of the semiconductor substrate SB to the lower surface of the well region WL. A potential barrier over an electron is formed between later-formed pixels by performing inter-pixel isolation implantation. Thereby, diffusion of electrons into an adjacent pixel in the semiconductor substrate can be prevented, which can improve the sensitivity property of an image sensor.

Subsequently, in order to control a threshold voltage Vth of a later-formed transfer transistor, the following semiconductor regions CH1 and CH2 are formed by performing ion implantation on the main surface of the semiconductor substrate SB (Step S5 in FIG. 7).

Figure 11:
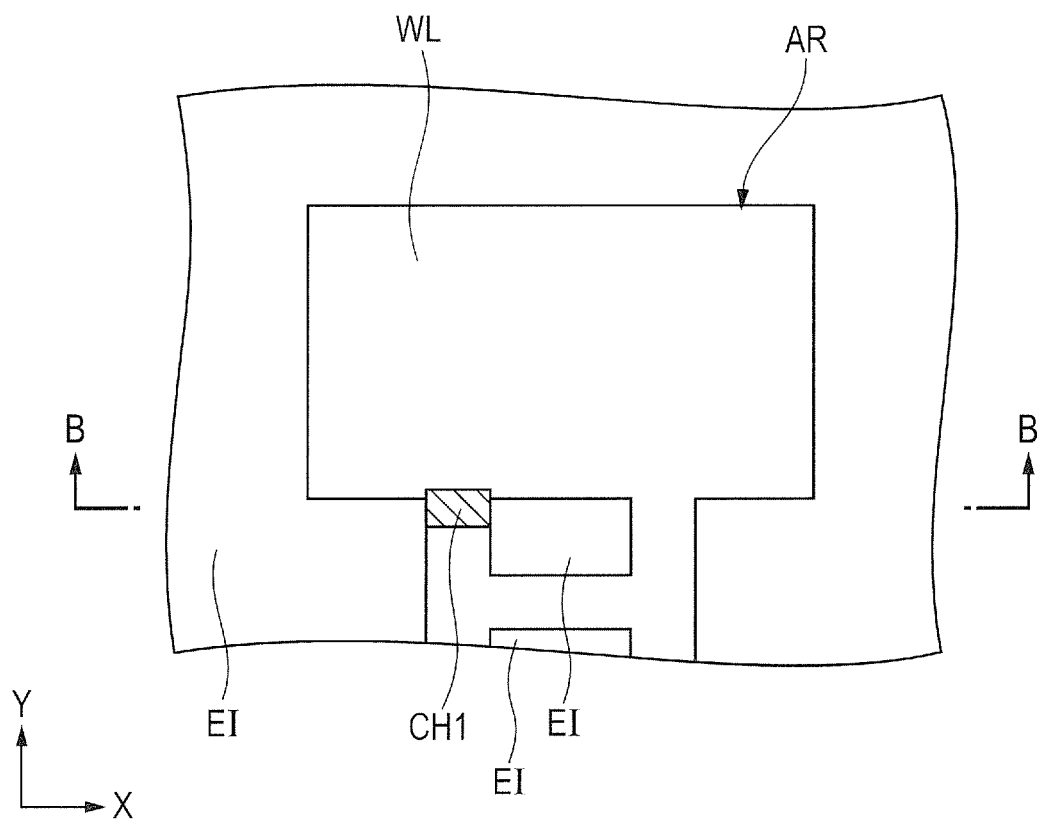
FIG. 11 is a plan view for explaining a manufacturing step of the semiconductor device, following FIG. 9.
Figure 12:
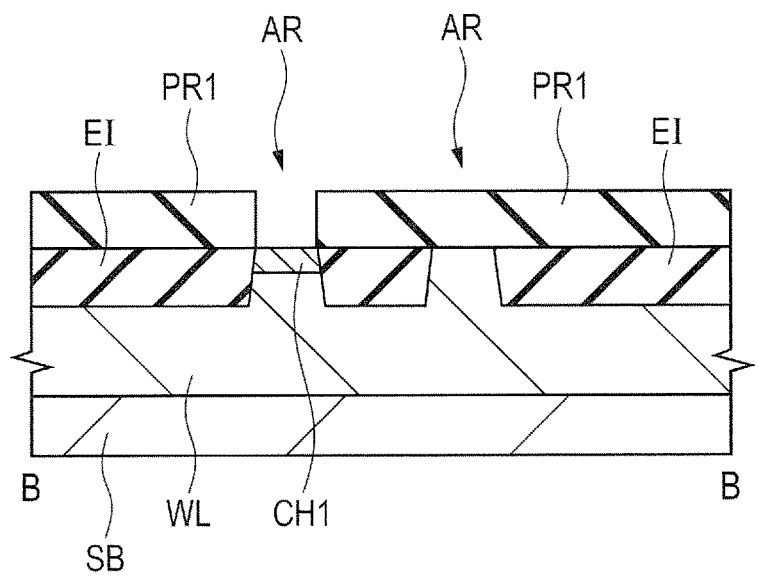
FIG. 12 is a sectional view for explaining the manufacturing step of the semiconductor device, following FIG. 9.

That is, after a photoresist film PR1 is formed over the semiconductor substrate SB by using a photolithography technique, the p-type semiconductor region CH1 is formed over the main surface of the semiconductor substrate SB by performing ion implantation with the use of the photoresist film PR1 as a mask, as illustrated in FIGS. 11 and 12. Herein, the semiconductor region CH1 is formed by implanting a relatively low concentration of p-type impurities (e.g., B (boron)) into the main surface of the semiconductor substrate SB. The formation depth of the semiconductor region CH1 is shallower than that of the element isolation region EI.

The semiconductor region CH1 is formed, of the active region AR, near the boundary between the rectangular region where the light receiving part will be formed and one of the aforementioned two protruding patterns. The place where the semiconductor region CH1 is formed is: a region between the region where the photodiode will be formed in a later step and the region where the floating diffusion capacitance part will be formed; and a region in the semiconductor substrate SB directly under the region where the gate electrode of the transfer transistor will be formed. That is, the place where the semiconductor region CH1 is formed is a region that will serve as the channel region of a later-formed first transfer transistor. Thereafter, the photoresist film PR1 is removed.

Figure 13:
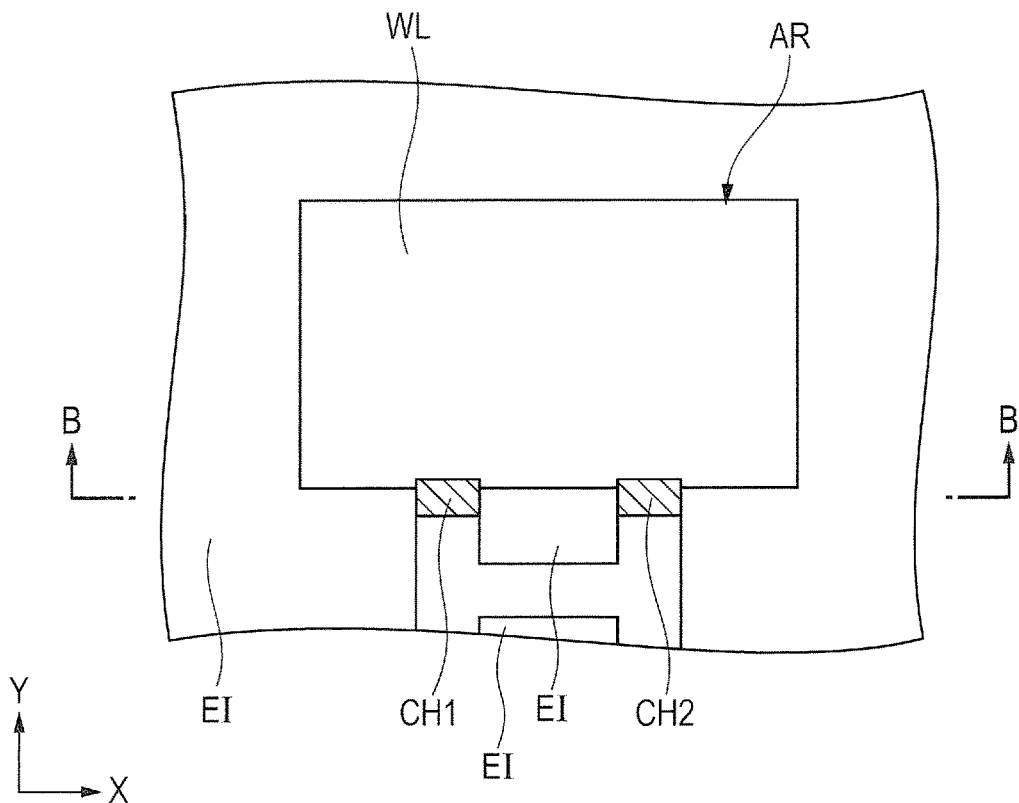
FIG. 13 is a plan view for explaining a manufacturing step of the semiconductor device, following FIG. 11.
Figure 14:
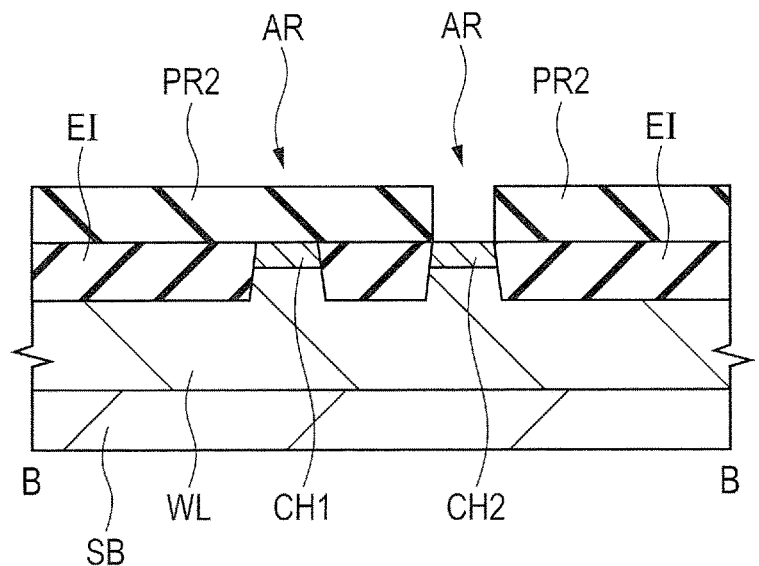
FIG. 14 is a sectional view for explaining the manufacturing step of the semiconductor device, following FIG. 11.

Subsequently, after a photoresist film PR2 is formed over the semiconductor substrate SB by using a photolithography-technique, the p-type semiconductor region CH2 is formed over the main surface of the semiconductor substrate SB by performing ion implantation with the use of the photoresist film PR2 as a mask, as illustrated in FIGS. 13 and 14. Herein, the semiconductor region CH2 is formed by implanting a relatively high concentration of p-type impurities (e.g., B (boron)) into the main surface of the semiconductor substrate SB. The formation depth of the semiconductor region CH2 is shallower than that of the element isolation region EI. The place where the semiconductor region CH2 is formed is a region that will serve as the channel region of a later-formed second transfer transistor.

In the aforementioned formation example, the impurity concentrations of the respective semiconductor regions CH1 and CH2 are set by selectively performing ion implantation on the places that will serve as the channel regions of two transfer transistors; however, a method for separately setting the imparity concentrations of the respective semiconductor regions CH1 and CH2 is not limited thereto. For example, the impurity concentration of a semiconductor region that will serve as the channel region of one of the transfer transistors may be set by performing ion implantation on the whole pixel region (active region) including two photodiode formation regions; and then the impurity concentration of the semiconductor region may be locally set by performing ion implantation with the use of a photoresist film, which exposes only a place that will serve as the channel region of the other of the transfer transistors, as a mask. As described above, other methods, different from the method described with reference to FIGS. 11 to 14, can be applied as the method for setting the impurity concentrations of both semiconductor regions to levels different from each other.

The semiconductor region CH2 is formed, of the active region AR, near the boundary between the rectangular area where the light receiving part will be formed and one of the aforementioned two protruding patterns. That is, the semiconductor region CH1 is formed adjacent to one of the two protruding patterns, while the semiconductor region CH2 is formed adjacent to the other of them. The place where the semiconductor region CH2 is formed is: a region between the region where a photodiode will be formed in a later step and the region where the floating diffusion capacitance part will be formed; and a region in the semiconductor substrate SB directly under the region where the gate electrode of a transfer transistor will be formed. Thereafter, the photoresist film PR2 is removed.

Either of the semiconductor regions CH1 and CH2 may be formed first. The p-type impurity concentration of the semiconductor region CH1 is smaller than that of the semiconductor region CH2.

Figure 15:
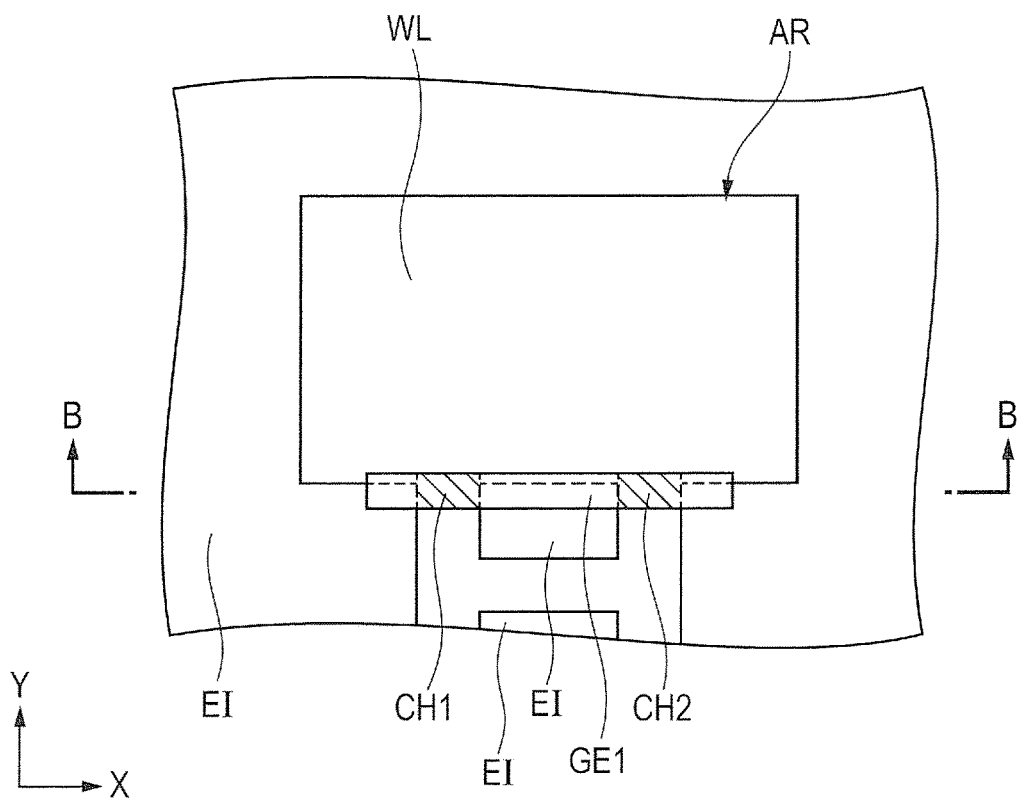
FIG. 15 is a plan view for explaining a manufacturing step of the semiconductor device, following FIG. 13.
Figure 16:
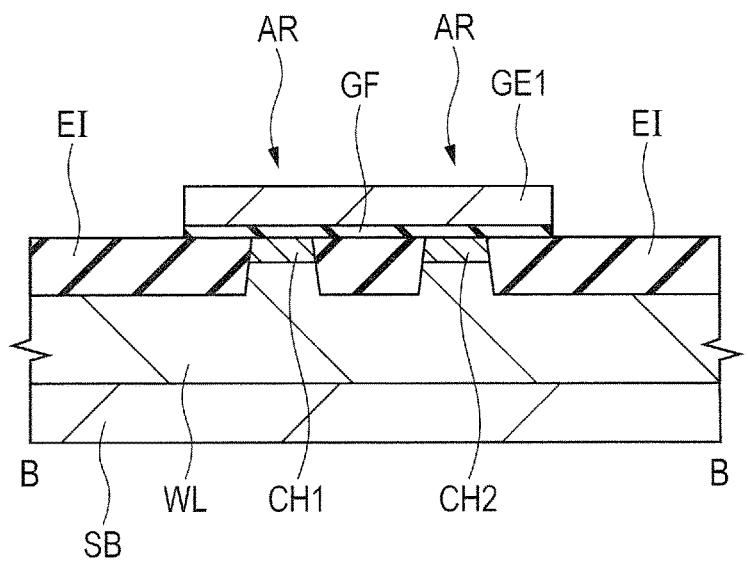
FIG. 16 is a sectional view for explaining the manufacturing step of the semiconductor device, following FIG. 13.

Subsequently, a gate electrode is formed over the semiconductor substrate via a gate insulation film (Step S6 in FIG. 7), as illustrated in FIGS. 15 and 16. Herein, the gate electrode GE1 is formed, of the active region AR, over the boundary between the region where the light receiving part will be formed and the region where the floating diffusion capacitance part will be formed, via the gate insulation film GF. That is, the gate electrode GE1, stretching directly over both the patterns of the active region AR protruding from two places at one side of the region where the light receiving part will be formed, is formed.

The gate electrode GE1 is formed directly over the semiconductor regions CH1 and CH2. The gate electrode GE1 forms the gate electrode of later-formed two transfer transistors. Herein, a gate electrode of a later-formed peripheral transistor (see FIG. 3) is also formed in the non-illustrated region.

Although not illustrated, a sidewall including an insulation film, such as a silicon oxide film or a silicon nitride film, is then formed over the side wall of the gate electrode GE1. The sidewall is formed in the following way in which, after an insulation film, covering the upper surface of the semiconductor substrate SB and the upper surface and the side wall of the gate electrode GE1, is formed, part of the insulation film is removed by performing dry etching, thereby exposing the upper surface of the gate electrode GE1. The sidewall is formed self-alignedly so as to cover the side wall of the gate electrode GE1.

Figure 17:
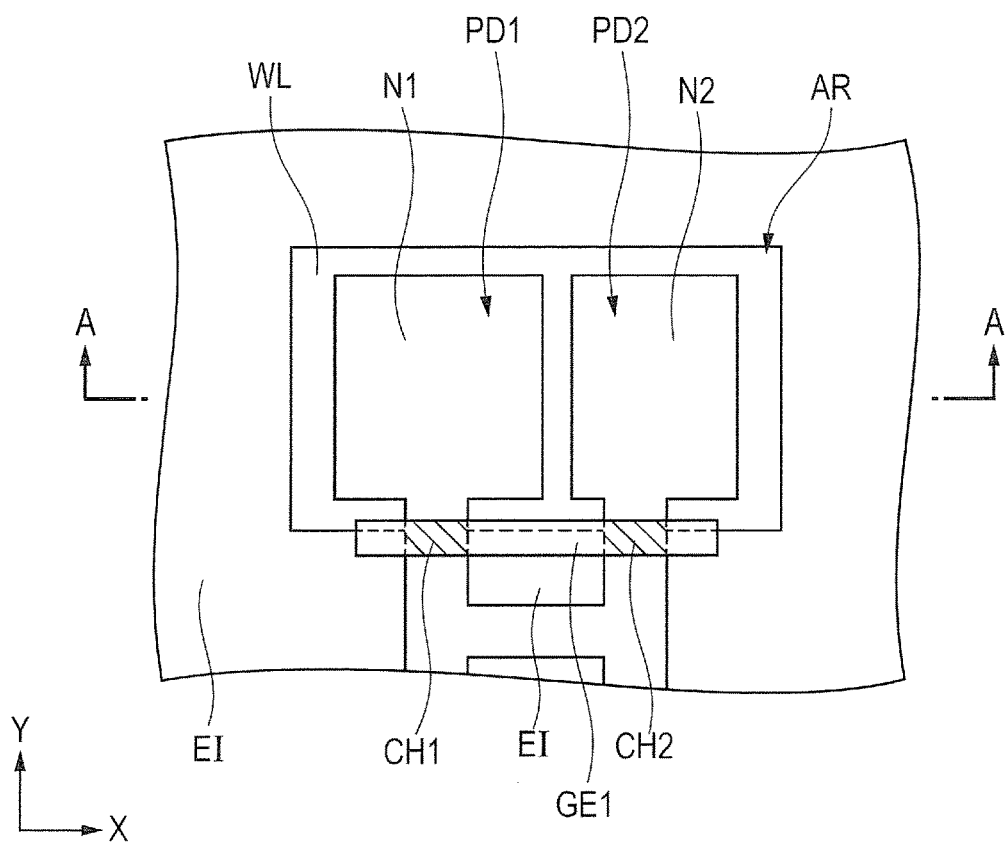
FIG. 17 is a plan view for explaining a manufacturing step of the semiconductor device, following FIG. 15.
Figure 18:
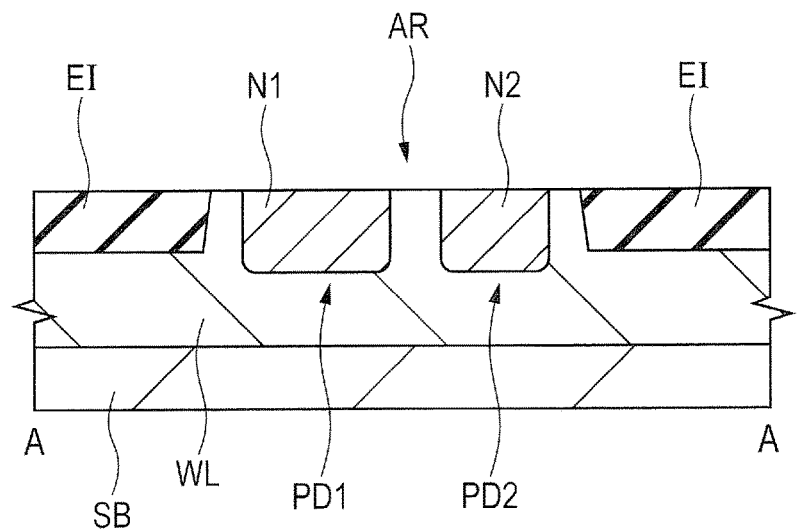
FIG. 18 is a sectional view for explaining the manufacturing step of the semiconductor device, following FIG. 15.

Subsequently, the photodiode PD1 including the n-type semiconductor region N1 and the photodiode PD2 including the n-type semiconductor region N2 are formed over the upper surface of the semiconductor substrate SB (Step S7 in FIG. 7), as illustrated in FIGS. 17 and 18. That is, the n-type semiconductor regions N1 and N2 are formed, of the active region AR, in the region where the light receiving part will be formed by implanting n-type impurities (e.g., arsenic (As) or P (phosphorus)) into the main surface of the semiconductor substrate SB with the use, for example, of ion implantation process. The n-type semiconductor regions N1 and N2 are formed so as to interpose, in the X-axis direction, the well region WL formed over the main surface of the semiconductor substrate SB therebetween.

Herein, the n-type semiconductor region N2 is formed after the n-type semiconductor region N1 is formed. Alternatively, the n-type semiconductor region N2 may be formed prior to the n-type semiconductor region N1.

The aforementioned implantation using ion implantation process is performed by using, as a mask, both the photoresist film (not illustrated) formed with the use of a photolithography technique and the gate electrode GE1. That is, after the n-type semiconductor region N1 i formed by performing ion implantation with the use of a first photoresist film and the gate electrode GE1 as a mask, the first photoresist film is removed, and the n-type semiconductor region N2 is subsequently formed by performing ion implantation with the use of a second photoresist film and the gate electrode GE1 as a mask. Thereafter, the second photoresist film is removed.

In this case, the area of the n-type semiconductor region N1, obtained in plan view, is larger than the area of the n-type semi conductor region N2, obtained in plan view. For example, the widths in the Y-axis direction of the n-type semiconductor regions N1 and N2 are set to be equal to each other, and the width in the X-axis direction of the n-type semiconductor region N1 is made larger than that of the n-type semiconductor region N2, Thus, the n-type semiconductor regions N1 and N2 are formed to have shapes different from each other in the present embodiment. Accordingly, the shapes and areas of the photodiodes PD1 and PD2 are different from each other.

In the ion implantation performed when the n-type semiconductor region N1 is formed, a relatively low concentration of n-type impurities are implanted into the main surface of the semiconductor substrate SB. In the ion implantation performed when the n-type semiconductor region N2 is formed, a relatively high concentration of n-type impurities are implanted into the main surface of the semiconductor substrate SB. Accordingly, the n-type impurity concentration of the n-type semiconductor region N1 is smaller than that of the n-type semiconductor region N2.

Thereby, the n-type semiconductor regions N1 and N2 are formed over the upper surface of the active region AR so as to be isolated from each other. Each of the n-type semiconductor regions N1 and N2 has a shape close to a rectangle in plan view. Herein, the n-type semiconductor regions N1 and N2 are formed from the main surface of the semiconductor substrate SB to a region deeper than the bottom of each of the semiconductor regions CH1 and CH2 and the element isolation region EI. However, the formation depths of the n-type semiconductor regions N1 and N2 are shallower than that of the well region WL.

Part of each of the n-type semiconductor regions N1 and N2 is formed in the semiconductor substrate SB in the region adjacent to the gate electrode GE1. That is, the n-type semiconductor region N1 forms the source region of the transfer transistor TX1 that is a field-effect transistor having the gate electrode GE1 and will be formed in a later step. The n-type semiconductor region N2 forms the source region of the transfer transistor TX2 that is a field-effect transistor having the gate electrode GE1 and will be formed in a later step. Part of the main surface of the semiconductor substrate SB directly under the gate electrode GE1 is a channel region, and the n-type semiconductor regions N1 and N2 are not formed.

Figure 19:
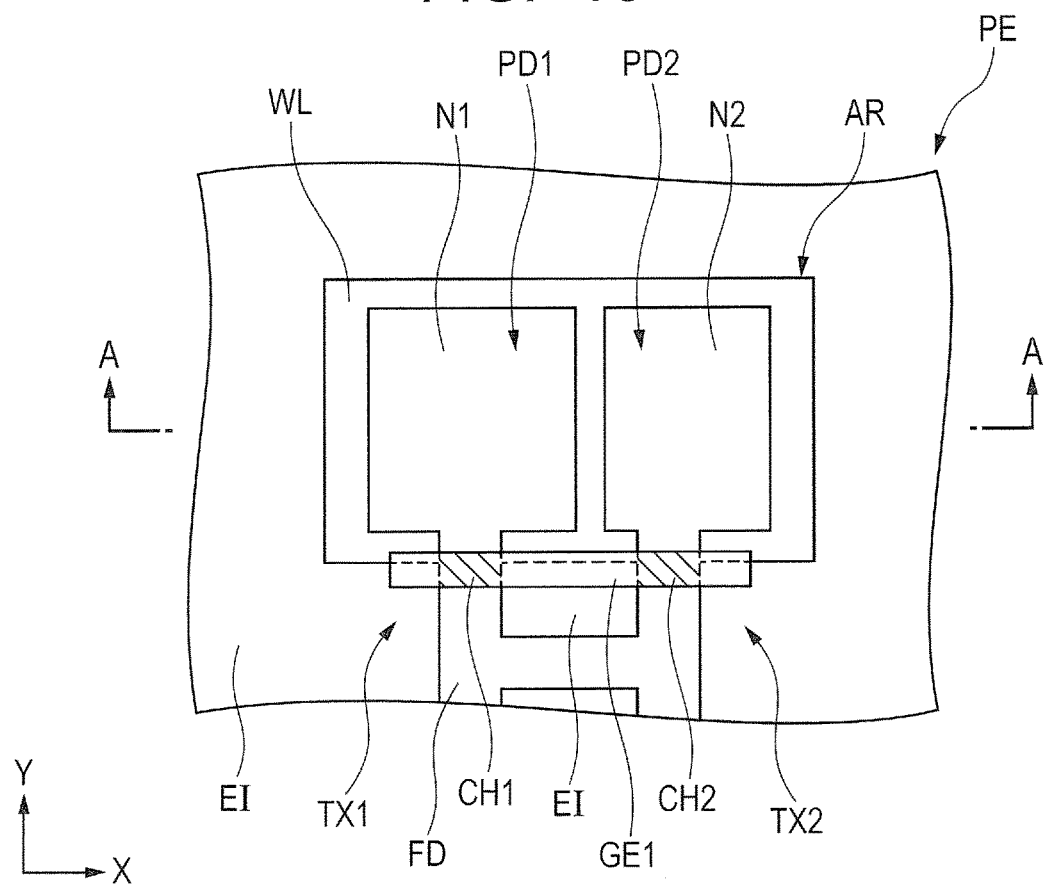
FIG. 19 is a plan view for explaining a manufacturing step of the semiconductor device, following FIG. 17.

Subsequently, the floating diffusion capacitance part FD, which is an n-type impurity region, is formed by implanting n-type impurities (e.g., arsenic (As) or P (phosphorus)) into part of the active region AR with the use, for example, of ion implantation process (Step S8 in FIG. 7), as illustrated in FIG. 19. Thereby, the transfer transistor TX1 having: the floating diffusion capacitance part FD as a drain region; the n-type semiconductor region N1 as a source region; and further the gate electrode GE1, and the transfer transistor TX2 having: the floating diffusion capacitance part FD as a drain region; the n-type semiconductor region N2 as a source region; and further the gate electrode GE1, are formed. In this step, a reset transistor, an amplifier transistor, and a select transistor, which are peripheral transistors, are formed by forming a source/drain region in a non-illustrated region.

The floating diffusion capacitance part FD is formed, of the active regions AR, in the region protruding from the rectangular light receiving part. That is, the active region AR is divided, in plan view, into both the light receiving part having the photodiodes PD1 and PD2 and the floating diffusion capacitance part FD with the gate electrode GE1 being the border. The transfer transistors TX1 and TX2 share the floating diffusion capacitance part FD as the drain regions thereof. The drain regions of the respective transfer transistors TX1 and TX2 may be isolated from each other in a planar layout. In that case, the respective drain regions, which are isolated from each other, are electrically coupled together via later-formed contact plugs and wires.

The pixel PE including the photodiodes PD1 and PD2, the transfer transistors TX1 and TX2, and other peripheral transistors (not illustrated) is formed by the above steps. Although not illustrated, multiple pixels PE are formed to be arrayed in a matrix pattern in the pixel array part over the semiconductor substrate SB.

When an n-type photodiode is formed, the drain region thereof is formed to have an n-type impurity concentration larger than those of the n-type semiconductor regions N1 and N2. Additionally, a method of forming a photodiode may also be adopted, in which: a $P^+$-layer is formed by implanting $P^+$-type impurities (e.g., B (boron)) into the surface portion of a photodiode region, such as the n-type semiconductor regions N1 and N2 illustrated in FIG. 18, such that the implantation depth is shallower than the n-type semiconductor regions N1 and N2; however, the case where a surface $P^+$-layer is not present will be described in the following description. The $P^+$-layer may be formed in the present embodiment.

Figure 20:
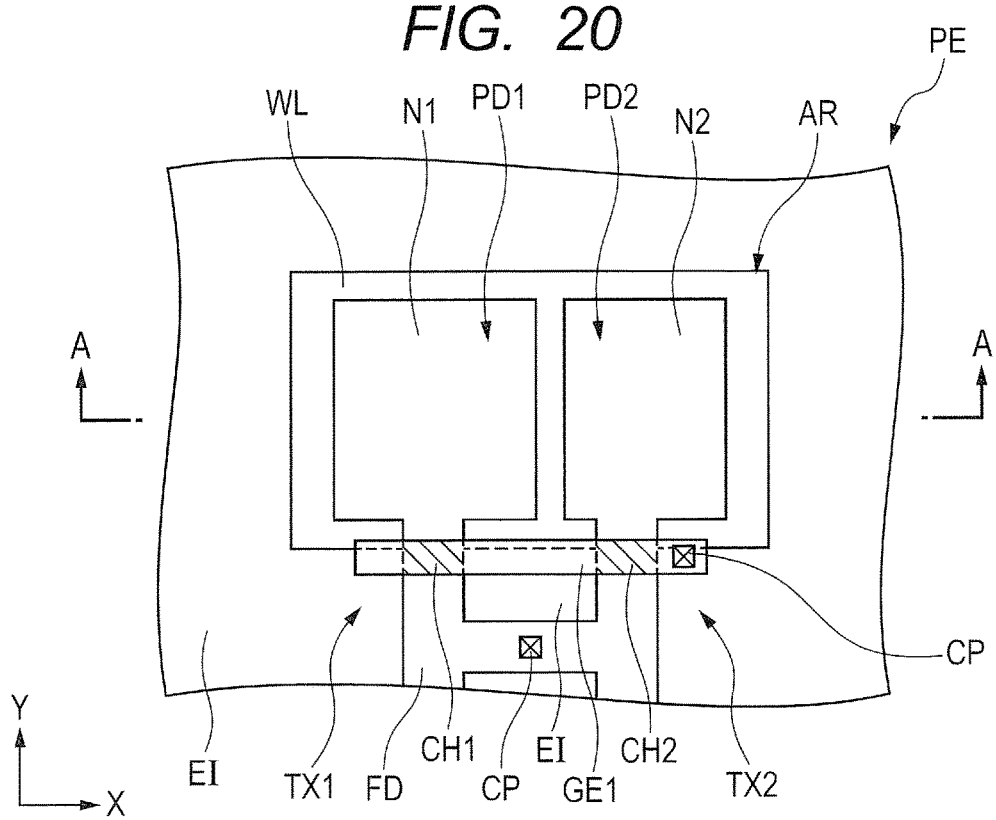
FIG. 20 is a plan view for explaining a manufacturing step of the semiconductor device, following FIG. 19.

Subsequently, a first interlayer insulation film (not illustrated) is formed over the semiconductor substrate (Step S9 in FIG. 7), and the contact plug CP penetrating the first interlayer insulation film is then formed (Step S10 in FIG. 7), as illustrated in FIG. 20.

Herein, the first interlayer insulation film including, for example, a silicon oxide film, is formed over the main surface of the semiconductor substrate so as to cover the transfer transistors TX1 and TX2, the photodiodes PD1 and PD2, and the like, by using, for example, a CVD (Chemical Vapor Deposition) process. Thereafter, a photoresist pattern is formed over the first interlayer insulation film, and contact holes, for exposing each of the gate electrode GE1, the floating diffusion capacitance part FD, and part of the peripheral transistor, are formed by performing dry etching with the use of the photoresist pattern as a mask. Herein, a silicide layer may be formed over the upper surface of each of the gate electrode GE1, the floating diffusion capacitance part FD, and part of the peripheral transistor. In this case, a contact hole is not formed directly over the light receiving part including the photodiodes PD1 and PD2.

Subsequently, after a metal film is formed over first interlayer insulation film including the contact holes, the metal film over the first interlayer insulation film is removed by grinding using, for example, a CMP (Chemical Mechanical Polishing) process. Thereby, the contact plugs CP, each including the metal film embedded in each of the contact holes, are formed. The contact plug CP is formed by a laminated film including, for example, both a titanium nitride film covering the side wall and bottom surface in the contact hole and a tungsten film that is embedded in the contact hole and is present over the bottom surface of the contact hole via the titanium nitride film. Each of the formed contact plugs CP is coupled to the upper surface of each of the gate electrode GE1, the floating diffusion capacitance part FD, the peripheral transistor gate electrode, the source/drain region of the peripheral transistor, and the like.

Although not illustrated, a first, wiring layer including a second interlayer insulation film and the wire M1 (see FIGS. 21 and 22), which is a lower layer wire, is then formed over the first interlayer insulation film (Step S11 in FIG. 7). The lower layer wire is formed by a so-called single damascene process.

Herein, the second interlayer insulation film including a silicon oxide film, etc., is formed over the first interlayer insulation film by using, for example, a CVD process. Thereafter, a wire trench, which is an opening penetrating the second interlayer insulation film and exposes the upper surfaces of the first interlayer insulation film and the contact plug CP, is formed by processing the second interlayer insulation film with the use of a photolithography technique and a dry etching process. Subsequently, a metal film is formed over the second interlayer insulation film including the inside of the wire trench, and the wire M1 (see FIGS. 21 and 22), including the metal film embedded in the wire trench, is formed by removing the extra metal film over the second interlayer insulation film with the use of a CMP process, or the like. The wire M1 is not formed directly over the respective photodiodes PD1 and PD2.

The wire M1 has a laminated structure in which, for example, a tantalum nitride film and a copper film are sequentially laminated. The side wall and bottom surface in the wire trench are covered with a tantalum nitride film. The wire M1 is coupled, at the bottom surface thereof, to the upper surface of the contact plug CP.

Figure 21:
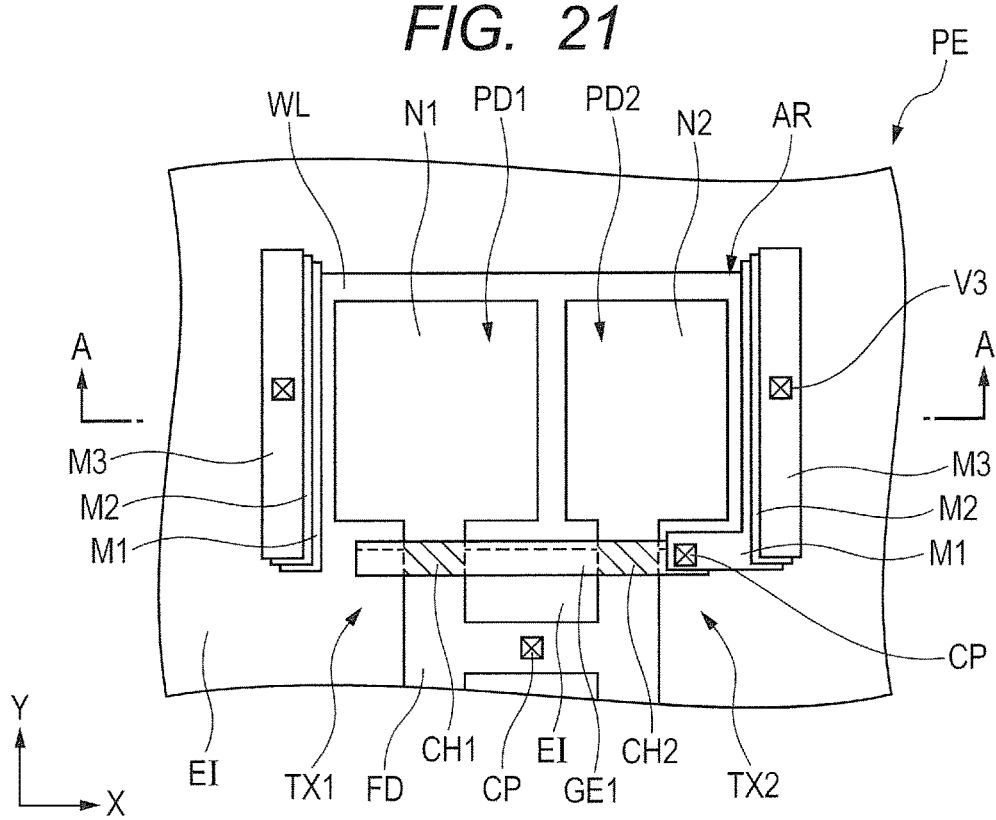
FIG. 21 is a plan view for explaining a manufacturing step of the semiconductor device, following FIG. 20.
Figure 22:
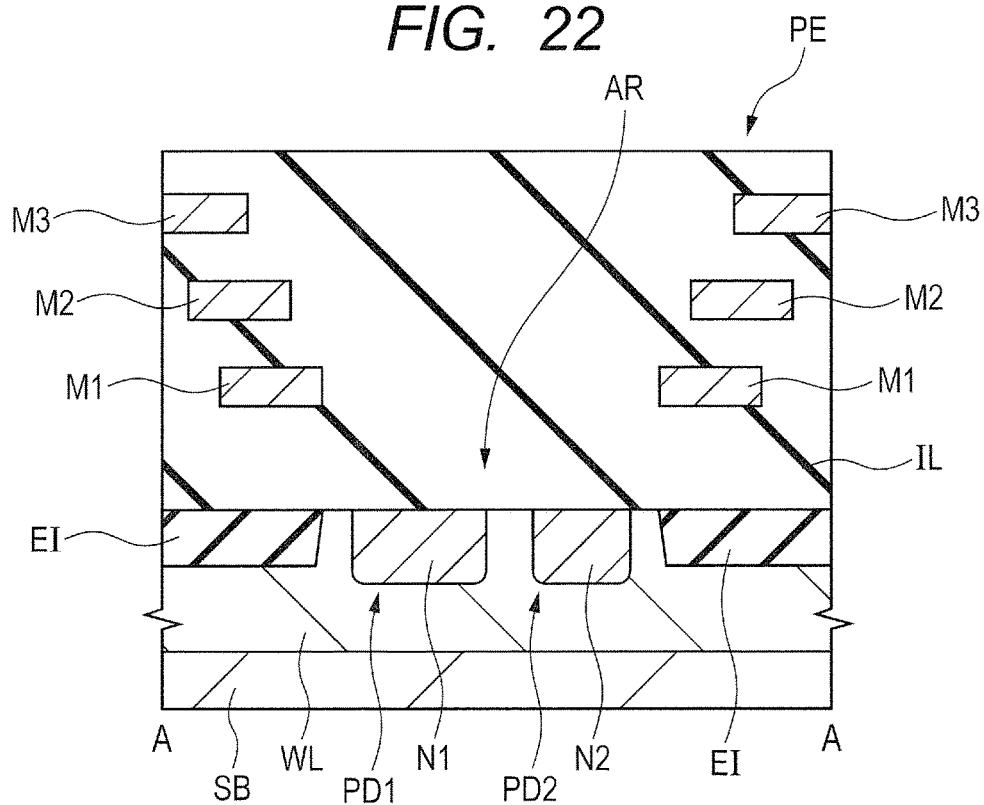
FIG. 22 is a sectional view for explaining the manufacturing step of the semiconductor device, following FIG. 20.

Subsequently, a plurality of wire layers including a plurality of upper layer wires are laminated over the second interlayer insulation film (Step S12 in FIG. 7), as illustrated in FIGS. 21 and 22. Thereby, a laminated wire layer is formed, the laminated wire layer including the second interlayer insulation film, a plurality of interlayer insulation films over the second interlayer insulation film, the wire M1, and the wires M2 and M3 that are a plurality of upper layer wires laminated over the wire M1. Herein, the wire M2 is formed over the wire M1 through a via (not illustrated), and the wire M3 is formed over the wire M2 through a via (not illustrated). Each of the upper layer wires and the via under each of them are formed by a so-called dual damascene process. FIG. 22 illustrates the first interlayer insulation film, the second interlayer insulation film, and other interlayer insulation films, which are all laminated over the semiconductor substrate SB, as one interlayer insulation film. IL.

In plan view, the wires M2 and M3 are formed at positions farther from the photodiodes PD1 and PD2 than the position of the wire M1 is far from the photodiodes PD1 and PD2. That is, the wires are not formed directly over the respective photodiodes PD1 and PD2. The interlayer insulation film IL is formed over the wire M3 that is the uppermost layer wire in the laminated wire layer. In FIG. 21, a via V3 formed between the wire M3 and the wire M2 is illustrated as penetrating the wire 3.

The dual damascene process is one in which: after a via hole penetrating, for example, an interlayer insulation film is formed, a wire trench shallower than the via hole is formed in the upper surface of the interlayer insulation film, and thereafter metal is embedded in the via hole and the wire trench, thereby allowing a via in the via hole and a wire in the wire trench over the via to be simultaneously formed. However, a via hole, penetrating from the bottom surface of a wire trench to the bottom surface of an interlayer insulation film, may be provided after the wire trench is formed. Each of the aforementioned via and the wires M2 and M3 mainly include a copper film. The wire M1 is electrically coupled to the wire M3 through the via and the wire M2.

The wires M1 to M3 illustrated on the right side of each of FIGS. 21 and 22 are coupled to the gate electrode GE1 via the contact plugs CP. That is, the wires M1 to M3 on the right side of each view are control wires to be used for controlling the transfer transistors TX1 and TX2 having the gate electrode GE1. The wires M1 to M3 on the left side of each view are wires to be used in applications other than the control of the transfer transistors TX1 and TX2.

Figure 23:
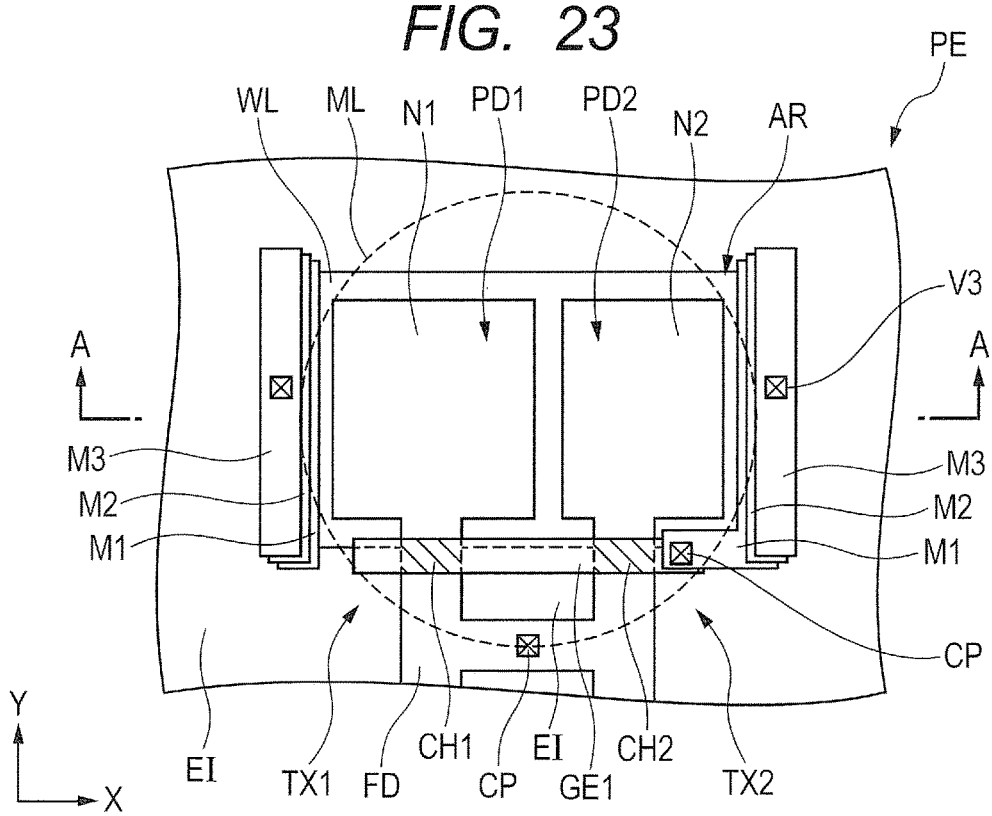
FIG. 23 is a plan view for explaining a manufacturing step of the semiconductor device, following FIG. 21.
Figure 24:
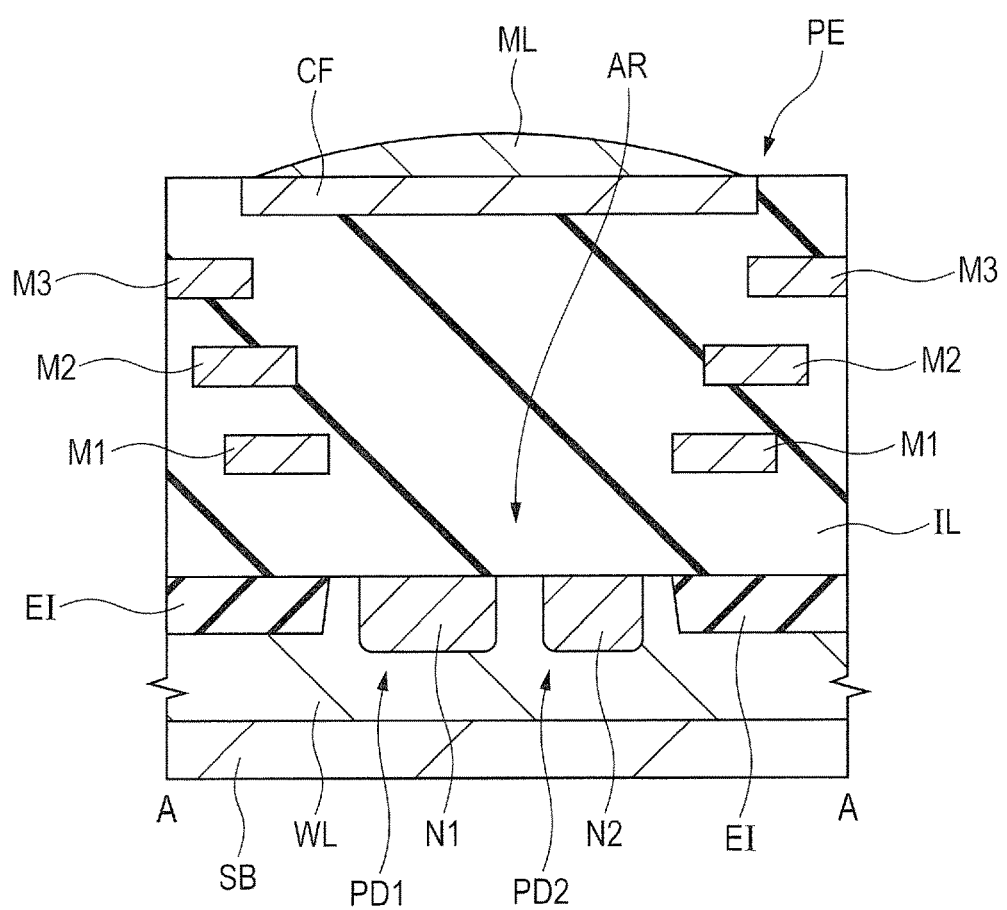
FIG. 24 is a sectional view for explaining the manufacturing step of the semiconductor device, following FIG. 21.

Subsequently, the color filter CF is formed over the interlayer insulation film IL (Step S13 in FIG. 7), and the microlens ML is then formed over the color filter CF and directly over the pixel PE (Step S14 in FIG. 7), as illustrated in FIGS. 23 and 24. In FIG. 23, the outline of the microlens ML is illustrated by a dashed line. The microlens ML and the photodiodes PD1 and PD2 overlap each other in plan view.

Herein, one pixel PE has the photodiodes PD1 and PD2, the floating diffusion region, and other transistors that form the pixel, but for convenience, the other transistors are not illustrated in the views.

The color filter CF is formed by embedding a film, including a material that transmits light having a predetermined wavelength and blocks light having other wavelengths, into a trench formed, for example, in the upper surface of the interlayer insulation film IL. It becomes possible by forming the color filter CF to emit, for example, only the light having specific color to the photodiodes PD1 and PD2; however, when it is not necessary to limit the color of the light to be detected by the pixel, the color filter CF may not be formed.

The microlens ML over the color filter CF is formed as follows: after a film formed over the color filter CF is processed into a circular pattern in plan view, the surface of the film is rounded, for example, by heating the film, thereby allowing the film to be processed into a lens shape.

In the subsequent steps, the semiconductor substrate SB, i.e., a semiconductor wafer is diced into a plurality of sensor chips by cutting the scribe lines of the semiconductor wafer, thereby allowing a plurality of solid-state image sensors each made by the sensor chip to be formed. Thereby, the semiconductor device according to the present embodiment including the solid-state image sensor is completed.

The steps of forming the semiconductor regions CH1 and CH2, described with reference to FIGS. 11 to 14, may be performed at any timing, as far as they are performed: after the step of forming the element isolation region EI (Step S3 in FIG. 7), described with reference to FIGS. 9 and 10; and before the step of forming the gate electrode GE1 (Step S6 in FIG. 7), described with reference to FIGS. 15 and 16.

Additionally, the step of forming the n-type semiconductor regions N1 and N2, described with reference to FIGS. 17 and 18, may be performed at any timing, as far as they are performed: after the step of forming the gate electrode GE1 (Step S6 in FIG. 7), described with reference to FIGS. 15 and 16; and before the step of forming a sidewall beside the gate electrode GE1.

When the manufacturing method of a semiconductor device according to the present embodiment is used, the same advantages as those in the semiconductor device according to the present embodiment described with reference to FIGS. 1 to 6, 29, and the like, can be obtained.

It can also be considered that, when the photodiode PD1 and PD2 are formed to have areas different from each other, or when the n-type semiconductor regions N1 and N2 are formed to have impurity concentrations different from each other, even without forming the semiconductor regions CH1 and CH2, the threshold voltages of the respective transfer transistors TX1 and TX2 may be different from each other. In this case, it is not necessary to form the semiconductor regions CH1 and CH2, and hence an increase in the manufacturing cost of a semiconductor device can be prevented.

Additionally, there may be the case where, when the semiconductor regions CH1 and CH2 are formed and a difference is created between the threshold voltages of the respective transfer transistors TX1 and TX2, the charges stored in the respective photodiodes PD1 and PD2 can be completely transferred, even without forming the n-type semiconductor regions N1 and N2 so as to have impurity concentrations different from each other. In this case, it is not necessary to form the n-type semiconductor regions M1 and N2 so as to have impurity concentrations different from each other, and hence the n-type semiconductor regions N1 and N2 can be formed in one ion implantation step. Accordingly, an increase in the manufacturing cost of a semiconductor device can be prevented. Further, in this case, it is not necessary to create a difference between the areas of the respective photodiodes PD1 and PD2 in order to adjust the numbers of saturated electrons of the respective photodiodes PD1 and PD2 such that the numbers thereof are equal to each other.

<Variations>

Figure 25:
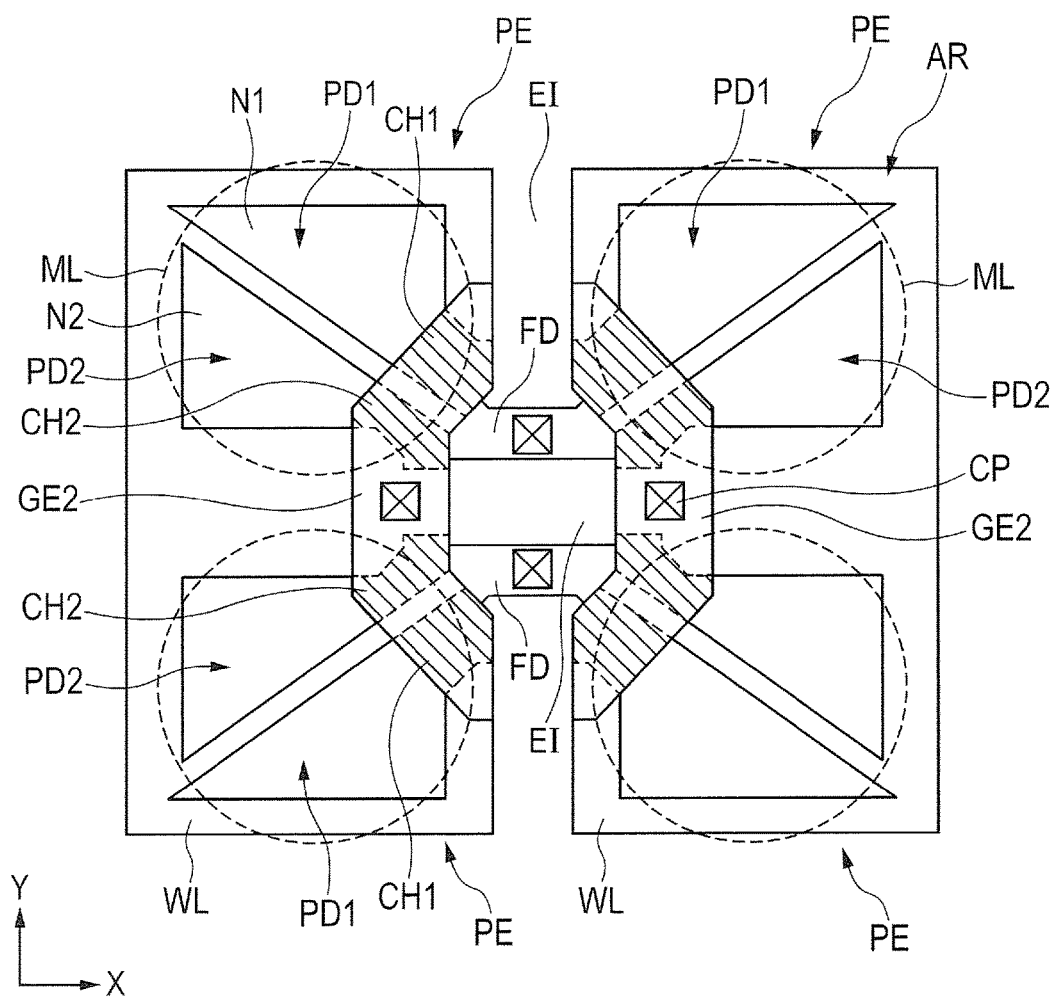
FIG. 25 is a plan view illustrating a semiconductor device according to a variation of First Embodiment of the invention.

Hereinafter, a semiconductor device according to a variation of the present embodiment will be described with reference to FIG. 25. FIG. 25 is a plan view of a solid-state image sensor that forms a semiconductor device according to a variation of the embodiment. FIG. 25 illustrates four of a plurality of pixels arrayed in a matrix pattern in a pixel array part. Herein, peripheral transistors, interlayer insulation films, wires, a color filter, and the like, are not illustrated.

In a solid-state image sensor according to the present variation, four pixels PE in the pixel array part are formed in one active region AR, as illustrated in FIG. 25. A floating diffusion capacitance part FD is also formed in the active region AR. The periphery of the active region AR is surrounded by an element isolation region EI. As illustrated by the dashed lines in the view, one microlens ML is formed above each of the four pixels PE.

Two photodiodes PD1 and PD2 are formed in each pixel PE, each of which has a planar shape close to a triangle. The triangle is a right triangle, and in the pixel PE, the longest side of the three sides of the photodiode PD1 and the longest side of the three sides of the photodiode PD2 face each other. Additionally, two pixels PE adjacent to each other in the row direction (X-axis direction) share one floating diffusion capacitance part FD, Also herein, a transfer transistor TX1 coupled to the photodiode PD1 and a transfer transistor TX2 coupled to the photodiode PD1 share the same gate electrode GE2 in the pixel PE. Additionally, directly under the gate electrode GE2, a p-type semiconductor region CH1 is formed in the channel region of the transfer transistor TX1, and a p-type semiconductor region CH2 is formed in the channel region of the transfer transistor TX2. The impurity concentration of the semiconductor region CH1 is smaller than that of the semiconductor region CH2.

The area of the photodiode PD1 is larger than that of the photodiode PD2. However, the n-type impurity concentration of the photodiode PD1 is smaller than that of the photodiode PD2, and hence the numbers of saturated electrons of the respective photodiodes PD1 and PD2 are equal to each other.

Because the semiconductor regions CH1 and CH2 are formed, the threshold voltage of the transfer transistor TX1 is smaller than that of the transfer transistor TX2. Accordingly, the transfer transistors TX1 and TX2 in the pixel PE can be sequentially operated by one gate electrode GE2, thereby allowing the charges generated in the respective photodiodes PD1 and PD2 to be separately read, also in the present variation. Accordingly, the same advantages as in the semiconductor device and the manufacturing method thereof, which have been described with reference to FIGS. 1 to 24, can be obtained.

When the photodiode PD1 having a triangular shape is provided, it can be considered that the transfer transistor TX1 is provided at an acute angle corner of the three corners in plan view of the photodiode PD1. Similarly, it can be considered that the transfer transistor TX2 is formed at an acute angle corner of the photodiode PD2. In this case, if the gate electrodes of the respective transfer transistors TX1 and TX2 are formed to be isolated from each other, the problem that the gate widths of the respective transfer transistors TX1 and TX2 may be decreased becomes more remarkable in comparison with the case where only one photodiode is provided in a pixel.

On the other hand, the respective transfer transistors TX1 and TX2 share one gate electrode GE2 in the present variation, and hence a gate width can be prevented from being decreased. Accordingly, the capability of transferring the charges in the respective photodiodes PD1 and PD2 by using the transfer transistors TX1 and TX2 can be prevented from being decreased.

Herein, the respective transfer transistors TX1 and TX2 in the pixel PE, which are adjacent to each other in the Y-axis direction, share the same gate electrode GE2. That is, the gate electrodes GE2 in the two pixels PE are coupled together. Accordingly, the number of the wires for controlling the transfer transistors TX1 and TX2 can be reduced in comparison with the case where the transfer transistors TX1 and TX2 in the adjacent pixels PE do not share a gate electrode.

When the respective semiconductor regions CH1 in two pixels PE sharing the gate electrode GE2 have impurity concentrations equal to each other, and when the respective semiconductor regions CH2 in the two pixels PE have impurity concentrations equal to each other, it can be considered that: the respective transfer transistors TX in the two pixels PE are simultaneously operated; and the respective transfer transistors TX2 in the two pixels PE are simultaneously operated. However, when the respective semiconductor regions CH1 and the respective semiconductor regions CH2 in the two pixels PE are formed to have impurity concentrations different from each other, it is also possible to read, at separate timings, the charges in the respective photodiodes PD1 and PD2 in the two pixels PE.

Herein, the respective transfer transistors TX1 and TX2 share one floating diffusion capacitance part FD protruding from a light receiving part in plan view. Accordingly, the ratio of the area occupied by the floating diffusion capacitance part FD to the area of the pixel PE can be reduced in comparison with the case where: the floating diffusion capacitance part FD of the transfer transistor TX1 is formed in one of two protruding parts protruding from the light receiving part; and the floating diffusion capacitance part FD of the transfer transistor TX2 is formed in the other of them. Accordingly, the aperture ratio of the light receiving part can be improved, thereby allowing the sensitivity of the pixel PE to be improved.

Second Embodiment

Figure 26:
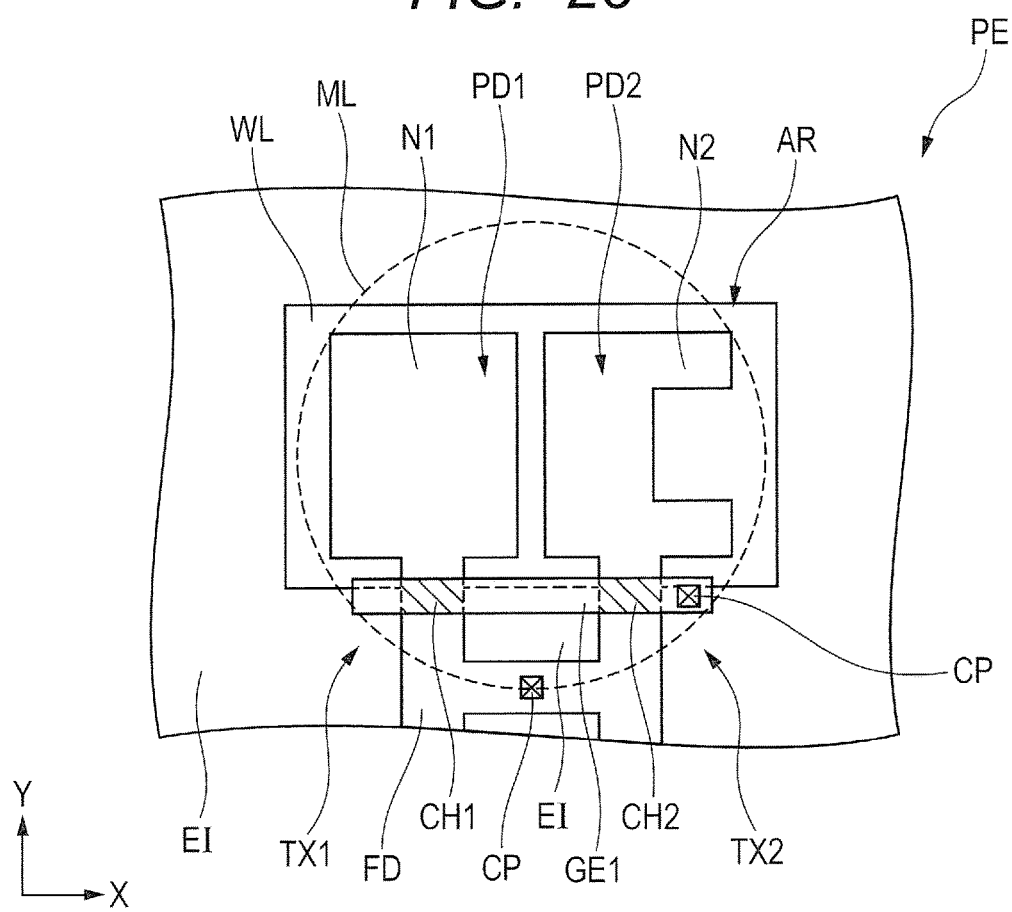
FIG. 26 is a plan view illustrating a semiconductor device according to Second Embodiment of the invention.

Hereinafter, a structure will be described with reference to FIG. 26, in which the central point between photodiodes in a pixel is caused to overlap the central point of a microlens. FIG. 26 is a plan view illustrating a semiconductor device of the present embodiment. In FIG. 26, peripheral transistors are not illustrated.

The structure of the pixel PE illustrated in FIG. 26 is almost the same as the pixel according to First Embodiment described with reference to FIG. 3; however, the shapes and positions of photodiodes PD1 and PD2 are different from those in the pixel illustrated in FIG. 3.

That is, the shape of the photodiode PD1 is a rectangle, but the photodiode PD2 having an area smaller than that of the photodiode PD1 has, in the X-axis direction and Y-axis direction, widths equal to those of the photodiode PD1, as illustrated in FIG. 26. However, the planar shape of the photodiode PD2 is one in which one side of a quadrangle is concave. That is, the photodiode PD2 has a U-shape in plan view.

The aforementioned one side having a concave portion in plan view is one located opposite, of the four sides of the photodiode PD2, to one side facing the photodiode PD1. In other words, of the two sides extending in the Y-axis direction of the photodiode PD2, the side far from the photodiode PD1 has a concave portion in plan view. A well region WL is formed in the concave portion.

The midpoint between the sides of the respective photodiodes PD1 and PD2, the sides facing each other, overlaps the central point of the circular microlens in plan view. That is, the central point of the microlens overlaps, in plan view, the well region WL between the respective photodiodes PD1 and PD2 that overlap the microlens. In other words, the central point of the microlens in plan view is located directly over the region between the respective photodiodes PD1 and PD2.

Subsequently, advantages of the present embodiment will be described with reference to a plan view of a pixel that is a semiconductor device of a comparative example illustrated in FIG. 30.

When two photodiodes are provided in a pixel, it is preferable to overlap the centers of the respective photodiodes and the central point of a microlens over the pixel, in order to obtain equivalent charges from the respective photodiodes. So, if a difference is created between the areas of photodiodes PD1 and PD2 by forming them so as to have widths different from each other, as illustrated in the comparative example of FIG. 30, the region between the photodiode PD 2 having a smaller area and an element isolation region EI becomes large, when the midpoint between the photodiodes PD1 and PD2 and the central point of a microlens are caused to overlap each other.

Figure 30:
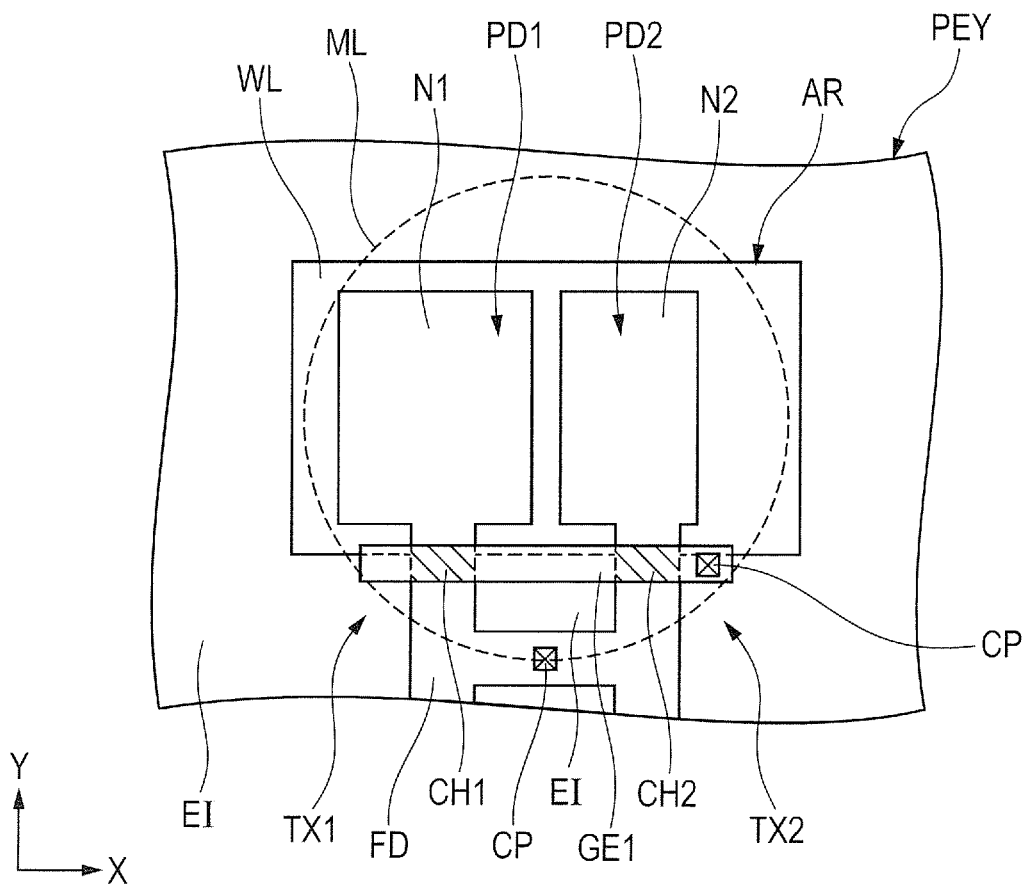
FIG. 30 is a plan view illustrating a semiconductor device of a comparative example.

In the comparative example, there is the fear that, when the electrons, generated by photoelectric conversion occurring when light is emitted to the region between the photodiode PD2 and the element isolation region EI, do not disappear along with the holes in the well region WL, they may move into a photodiode in another pixel (not illustrated) adjacent to a pixel PEY illustrated in FIG. 30, not into an n-type semiconductor region N2 that forms the photodiode PD2. In this case, accurate charge signals cannot be obtained in each pixel, and hence a problem is caused, in which imaging performance and auto focus performance may be decreased.

On the other hand, it can be considered that, in order to prevent the space between the photodiode PD2 and the element isolation region EI from being increased, an active region AR is reduced by bringing the element isolation region EI close to the photodiode PD2. In this case, however, the region, from which electrons can be obtained when light is received, is reduced, and hence the sensitivity of the pixel PEY is decreased. Additionally, there is the possibility that light may be emitted to the upper surface of the element isolation region EI adjacent to the photodiode PD2. If light is emitted to the upper surface of the element isolation region EI, there is the fear that the light may be reflected by the upper surface thereof and may enter a light receiving part in another pixel, so that electrons are generated. In this case, accurate charge signals cannot be obtained in each pixel, and hence a problem is caused, in which imaging performance and auto focus performance may be decreased.

So, in the semiconductor device according to the present embodiment illustrated in FIG. 26, the maximum widths in the X-axis direction of the respective photodiodes PD1 and PD2 are set to be equal to each other, and the maximum widths in the Y-axis direction thereof are set to be equal to each other. Additionally, by providing a concave portion at one side of the photodiode PD2, a difference is created between the areas of the respective photodiodes PD1 and PD2, similarly to First Embodiment.

Thereby, occurrence of overlapping of the center between the photodiodes PD1 and PD2 and the central point of the microlens ML, and occurrence of a large space between the photodiode PD2 having a smaller area and the element isolation region EI, can be prevented. Although the distance between the concave portion and the element isolation region EI is relatively large, the periphery of the concave portion is surrounded by the n-type semiconductor region N2 except the element isolation region EI side, and hence photoelectric conversion electrons generated in the well region WL, which is the concave portion, are drawn into the n-type semiconductor region N2 located close to the well region WL. Accordingly, electrons can be prevented from moving between pixels, and hence accurate charge signals can be obtained in each pixel, thereby allowing imaging performance and auto focus performance to be improved.

Further, the center between the photodiodes PD1 and PD2 and the central point of the microlens ML are caused to overlap each other, and hence the conditions under which electrons are generated can be made equivalent in the photodiodes PD1 and PD2 in the pixel PE. Accordingly, the accuracy and speed of an image surface phase difference auto focus operation can be improved.

Herein, it can be considered that the concave portion of the photodiode PD2 may be formed at the side facing the photodiode PD1. However, of the four sides of the photodiode PD2, the side facing the photodiode PD1 is located close to the center of the pixel PE and the center thereof is located at a place to which light is particularly likely to be emitted, and hence it is not preferable to provide a concave portion at the side from the viewpoint of improving the sensitivity of a pixel. Accordingly, by providing a concave portion at the side farthest from the center of a pixel, i.e., at the side close to the element isolation region EI, of the four sides of the photodiode PD2, the sensitivity of the pixel PE can be prevented from being decreased.

<Variation>

Figure 27:
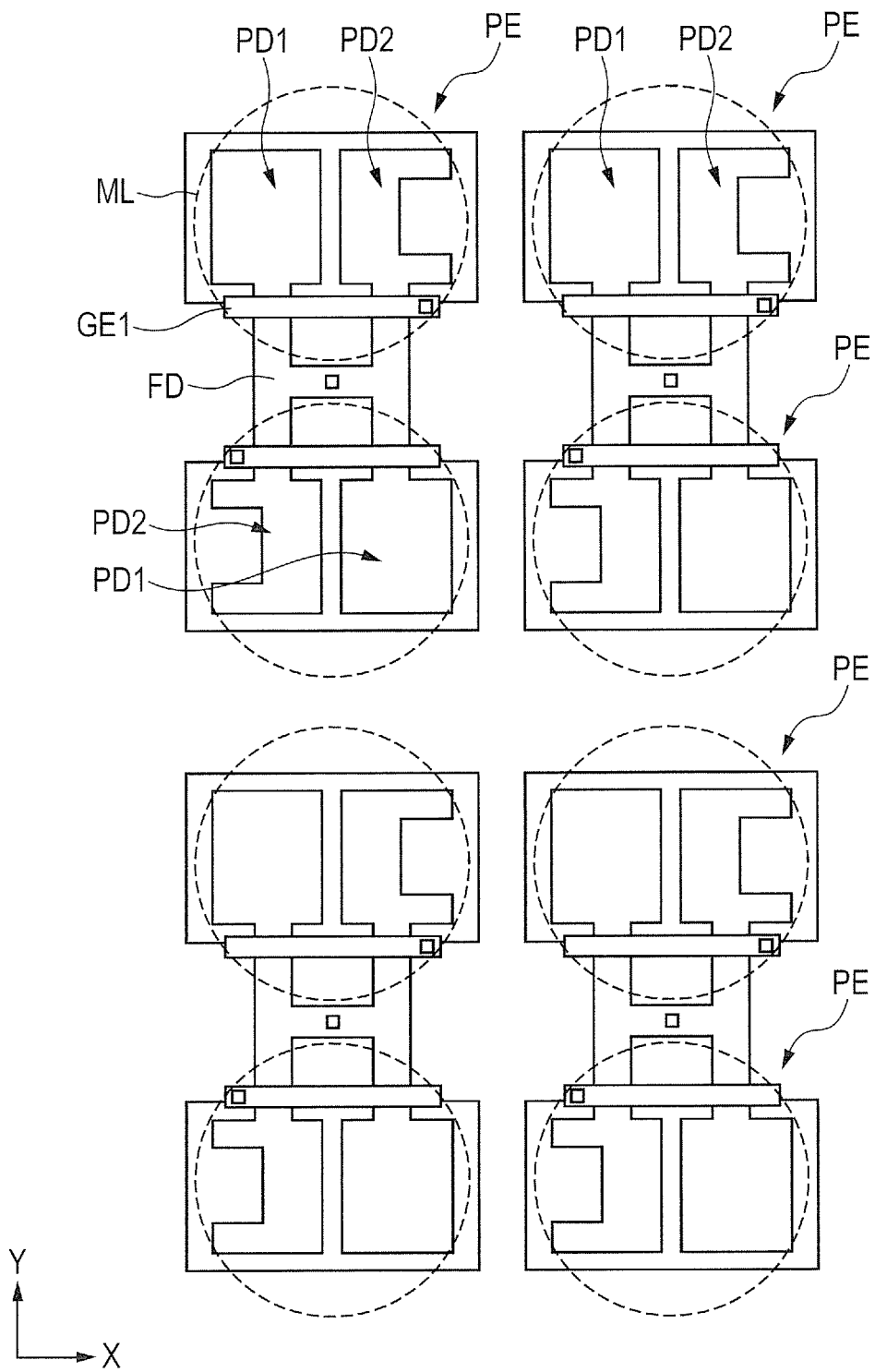
FIG. 27 is a plan view illustrating a semiconductor device according to a variation of Second Embodiment of the invention.

Hereinafter, a variation of the present embodiment will be described with reference to FIG. 27. FIG. 27 is a plan view illustrating a semiconductor device according to a variation of the embodiment. FIG. 27 illustrates eight pixels arrayed in a pixel array part.

In the layout illustrated in FIG. 27, two pixels PE adjacent to each other in the Y-axis direction share a floating diffusion capacitance part FD. However, in the layout described with reference to FIG. 2, the layouts of the two pixels PE adjacent to each other in the Y-axis direction are in a line-symmetrical relationship; however, the layouts of the two pixels PE adjacent to each other in the Y-axis direction are in a point-symmetrical relationship in the present variation.

That is, of the two pixels PE adjacent to each other in the Y-axis direction, in a first pixel PE, photodiodes PD1 and PD2 are sequentially arrayed in the X-axis direction from the left side toward the right side of the view; while in a second pixel PE, photodiodes PD1 and PD2 are sequentially arrayed in the X-axis direction from the left side toward the right side of the view. That is, in the first pixel PE, the photodiode PD2 having a concave portion in a planar shape is located on the right side of the view; while in the second pixel PE, the photodiode PD2 having a concave portion in a planar shape is located on the left side of the view.

Additionally, the respective pixels PE arrayed in the X-axis direction have layouts the same as each other. That is, the layouts of the respective pixels PE adjacent to each other in the X-axis direction are neither in a line-symmetrical relationship nor in a point-symmetrical relationship. Accordingly, in the pixel array part, the photodiodes PD1 and PD2 are alternately arranged in each of the Y-axis direction and the X-axis direction.

By alternately arranging the photodiode PD1 having a relatively large area and the photodiode PD2 having a relatively small area, as described above, a variation can be prevented from occurring in charge signals obtained when light is received, by providing the photodiode PD2 having a concave portion in the whole solid-state image sensor. That is, in the whole solid-state image sensor, unevenness can be prevented from occurring in charge signals obtained when light is received, and hence imaging performance and auto focus performance can be prevented from being decreased.

Figure 28:
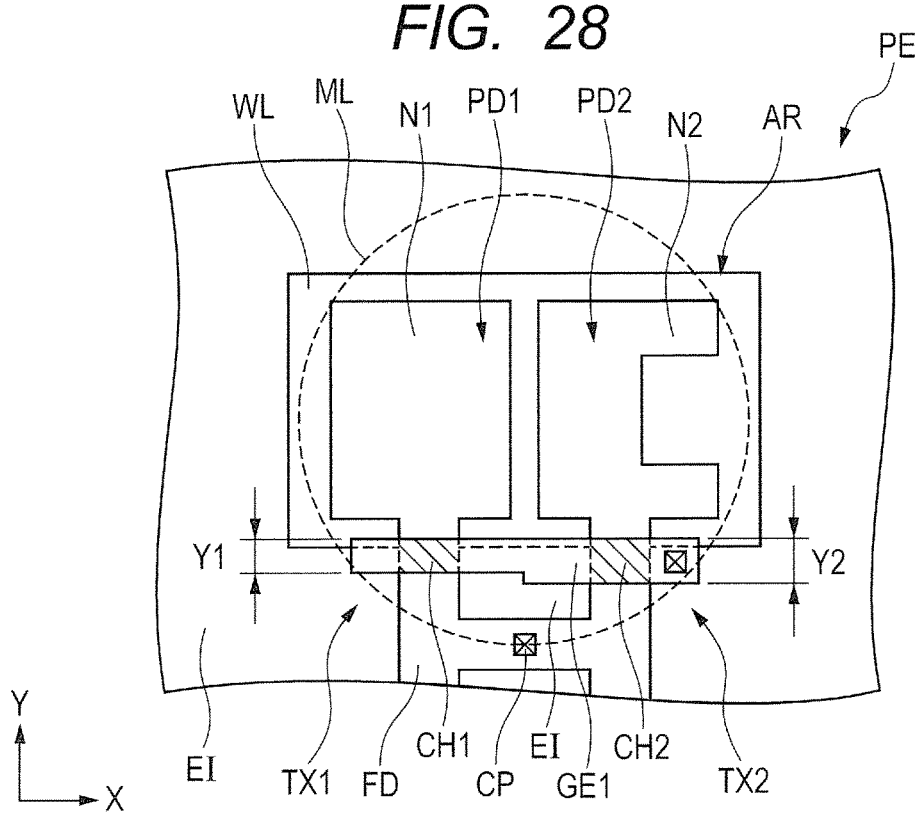
FIG. 28 is a plan view illustrating a semiconductor device according to Third Embodiment of the invention.

A configuration, in which the photodiodes PD1 and PD2 are alternately arrayed in the X-axis direction and the Y-axis direction as in the present variation, can be applied to the aforementioned First Embodiment and the later-described Third Embodiment. Also in the case of First Embodiment, unevenness can be prevented from occurring in charge signals in the whole solid-state image sensor, by arraying only the photodiodes PD2 each having a relatively small area in the Y-axis direction, Third Embodiment Hereinafter, a way will be described with reference to FIG. 28, in which the gate lengths of the gate electrode shared by two transfer transistors in a pixel are made different from each other in the respective two transfer transistors. FIG. 28 is a plan view illustrating a semiconductor device according to the present embodiment. In FIG. 28, peripheral transistors are not illustrated. Although the planar layouts of the photodiodes PD1 and PD2 illustrated in FIG. 28 are similar to those of the photodiodes PD1 and PD2 illustrated in FIG. 26, but planar layouts similar to those of the photodiodes PD1 and PD2 illustrated in FIG. 3 may be applied.

Although the structure of the pixel PE illustrated in FIG. 28 is almost the same as the pixel of the Second Embodiment described with reference to FIG. 26, but the shape of gate electrode GE1 is different from the pixel PE illustrated in FIG. 26. Additionally, in the pixel PE illustrated in FIG. 28, there is no difference between the p-type impurity concentration of the channel region of the transfer transistor TX1 and that of the channel region of transfer transistor TX2, unlike First Embodiment and Second Embodiment. That is, the impurity concentrations of the respective semiconductor regions CH1 and CH2 are equal to each other. Alternatively, the semiconductor regions CH1 and CH2 may not be formed.

The gate length of a transfer transistor described herein means the length of the gate electrode between a photodiode and a floating diffusion capacitance part. That is, the lengths in the Y-axis direction of the gate electrode GE are the gate lengths of the respective transfer transistors TX1 and TX2. As illustrated in FIG. 28, a gate length Y1 of the transfer transistor TX1 is smaller than a gate length Y2 of the transfer transistor TX2. That is, the width in the Y-axis direction of the gate electrode GE1 on the photodiode PD1 side is smaller than that of the gate electrode GE1 on the photodiode PD2 side. Accordingly, the threshold voltage of the transfer transistor TX1 is smaller than that of the transfer transistor TX2.

In the present embodiment, a difference is created between the threshold values of the respective transfer transistors TX1 and TX2 by setting the gate lengths Y1 and Y2 of the gate electrode GE1 of the respective transfer transistors TX1 and TX2 to magnitudes different from each other. Thereby, the gate electrode GE1 of the transfer transistors TX1 and TX2 can be coupled together, and the charges in the respective photodiodes PD1 and PD2 can be separately read, even without setting the impurity concentrations of the channel regions to be different from each other.

Accordingly, it becomes unnecessary to create a difference between the concentrations of the channel regions of the respective transfer transistors TX1 and TH2 by performing two ion implantation steps, as described with reference to FIGS. 11 to 14. Accordingly, even when the semiconductor regions CH1 and CH2 illustrated in FIG. 28 are formed, they can be formed by one ion implantation step using the same mask. Accordingly, the manufacturing steps of a semiconductor device can be simplified, and hence the manufacturing cost thereof can be reduced.

The invention made by the present inventors has been specifically described above based on preferred embodiments, but the invention should not be limited to the preferred embodiments, and it is needless to say that various modifications may be made to the invention within a range not departing from the gist of the invention.

Although a structure, in which two photodiodes are provided in a pixel, has been described in the aforementioned First to Third Embodiments, the number of photodiodes to be provided in a pixel may be, for example, even and larger than 2.

What is claimed is:

1. A semiconductor device having a solid-state image sensor provided with a pixel including a first photodiode and a second photodiode; the semiconductor device comprising:
    a semiconductor substrate;
    the first photodiode and the second photodiode that are arrayed over an upper surface of the semiconductor substrate in an active region;
    a gate electrode formed over the semiconductor substrate;
    a first transfer transistor that has the gate electrode and transfers a charge in the first photodiode to a floating diffusion capacitance part; and
    a second transfer transistor that has the gate electrode and transfers a charge in the second photodiode to the floating diffusion capacitance part,
    wherein the first transfer transistor and the second transfer transistor share the gate electrode.

2. The semiconductor device according to claim 1, wherein an area of the first photodiode is larger than an area of the second photodiode in plan view.

3. The semiconductor device according to claim 1,
wherein a threshold voltage of the first transfer transistor is smaller than a threshold voltage of the second transfer transistor.

4. The semiconductor device according to claim 3, further comprising:
a first semiconductor region that is formed over the upper surface of the semiconductor substrate directly under the gate electrode forming the first transfer transistor and has a first conductivity type; and
a second semiconductor region that is formed over the upper surface of the semiconductor substrate directly under the gate electrode forming the second transfer transistor and has the first conductivity type,
wherein the first transfer transistor and the second transfer transistor are field-effect transistors of a second conductivity type different from the first conductivity type, and
wherein a concentration of impurities of the first conductivity type of the first semiconductor region is smaller than a concentration of impurities of the first conductivity type of the second semiconductor region.

5. The semiconductor device according to claim 1, further comprising:
a well region that is formed over the upper surface of the semiconductor substrate and has a first conductivity type; and
a third semiconductor region and a fourth semiconductor region that have a second conductivity type different from the first conductivity type and are arrayed over an upper surface of the well region,
wherein the third semiconductor region forms the first photodiode, and the fourth semiconductor region forms the second photodiode, and
wherein a concentration of impurities of the second conductivity type of the third semiconductor region is smaller than a concentration of impurities of the second conductivity type of the fourth semiconductor region.

6. The semiconductor device according to claim 1,
wherein a plurality of transfer transistors including the first transfer transistor and the second transfer transistor and a plurality of photodiodes including the first photodiode and the second photodiode are formed in the pixel, and
wherein the number of gate electrodes that form the transfer transistors is smaller than the number of the photodiodes.

7. The semiconductor device according to claim 1, further comprising:
a wire electrically coupled to the gate electrode.

8. The semiconductor device according to claim 1,
wherein the solid-state image sensor is a Front Side Illumination type solid-state image sensor.

9. The semiconductor device according to claim 1,
wherein the solid-state image sensor is a Back Side Illumination type solid-state image sensor.

10. The semiconductor device according to claim 1, further comprising:
a lens formed directly over the pixel,
wherein the lens has a circular shape in plan view, and
wherein a center of the lens is located, in plan view, between the first photodiode in the pixel and the second photodiode in the pixel.

11. The semiconductor device according to claim 1,
wherein a shape of the first photodiode and a shape of the second photodiode are different from each other in plan view.

12. The semiconductor device according to claim 1,
wherein a plurality of the pixels are arranged in a matrix pattern in a pixel array part in the solid-state image sensor, and
wherein the first photodiode and the second photodiode in the pixel are arranged to be arrayed in a first direction, and
wherein the first photodiode and the second photodiode are arranged to be alternately arrayed in a second direction that intersects with the first direction at right angles.

13. The semiconductor device according to claim 1,
wherein a gate length of the gate electrode that forms the first transfer transistor is smaller than a gate length of the gate electrode that forms the second transfer transistor.

14. A manufacturing method of a semiconductor device having a solid-state image sensor provided with a pixel including a first photodiode and a second photodiode, the manufacturing method comprising:
(a) providing a semiconductor substrate;
(b) forming a well region having a first conductivity type over an upper surface of the semiconductor substrate;
(c) forming a gate electrode over the semiconductor substrate;
(d) forming a first semiconductor region and a second semiconductor region that have a second conductivity type different from the first conductivity type and are arrayed over an upper surface of the well region; and
(e) forming a first transfer transistor that has the gate electrode and transfers a charge in the first semiconductor region to a floating diffusion capacitance part and a second transfer transistor that has the gate electrode and transfers a charge in the second semiconductor region to the floating diffusion capacitance part,
wherein the first semiconductor region forms the first photodiode, and the second semiconductor region forms the second photodiode,
wherein the first transfer transistor and the second transfer transistor share the gate electrode.

15. The manufacturing method of a semiconductor device according to claim 14, further comprising:
(b1) after the operation (b) and before the operation (c), forming a third semiconductor region having the first conductivity type in a first region over an upper surface of the semiconductor substrate; and
(b2) after the operation (b) and before the operation (c), forming a fourth semiconductor region having the first conductivity type in a second region over the upper surface of the semiconductor substrate,
wherein, in the operation (c), the gate electrode is formed directly over each of the third semiconductor region and the fourth semiconductor region, and
wherein the third semiconductor region forms a channel region of the first transfer transistor, and the fourth semiconductor region forms a channel regions of the second transfer transistor, and
wherein a concentration of impurities of the first conductivity type of the third semiconductor region is smaller than a concentration of impurities of the first conductivity type of the fourth semiconductor region.

16. The manufacturing method of a semiconductor device according to claim 14,
wherein a concentration of impurities of the second conductivity type of the first semiconductor region is smaller than a concentration of impurities of the second conductivity type of the second semiconductor region.

17. The manufacturing method of a semiconductor device according to claim 14, further comprising:
(f) after the operation (e), forming a wire electrically coupled to the gate electrode over the semiconductor substrate.

18. The manufacturing method of a semiconductor device according to claim 14,
wherein a gate length of the gate electrode that forms the first transfer transistor is smaller than a gate length of the gate electrode that forms the second transfer transistor.

19. An image sensor comprising:
a semiconductor substrate;
a pixel including a first photodiode and a second photodiode, the first photodiode and the second photodiode are arrayed over an upper surface of the semiconductor substrate in an active region;
a gate electrode formed over the semiconductor substrate;
a first transfer transistor configured to transfer a charge in the first photodiode to a floating diffusion capacitance part; and
a second transfer transistor configured to transfer a charge in the second photodiode to the floating diffusion capacitance part,
wherein the first transfer transistor and the second transfer transistor share the gate electrode.

* * * * *